United States Patent [19]
Satoh et al.

[11] Patent Number: 5,179,310
[45] Date of Patent: Jan. 12, 1993

[54] SURFACE-ACOUSTIC-WAVER FILTER HAVING A PLURALITY OF ELECTRODES

[75] Inventors: Yoshio Satoh, Atsugi; Osamu Ikata, Ebina; Tsutomu Miyashita, Inagi; Mitsuo Takamatsu, Hadano; Takashi Matsuda, Yokohama, all of Japan

[73] Assignee: Fujitsu Limited, Kawasaki, Japan

[21] Appl. No.: 672,018

[22] Filed: Mar. 19, 1991

[30] Foreign Application Priority Data

Mar. 19, 1990 [JP] Japan .................................. 2-69121
Mar. 30, 1990 [JP] Japan .................................. 2-86236

[51] Int. Cl.$^5$ ............................................. H01L 41/08
[52] U.S. Cl. ............................. 310/313 B; 310/313 D; 333/154
[58] Field of Search ............. 310/313 B, 313 D; 333/150, 153, 154, 193, 195, 196

[56] References Cited

U.S. PATENT DOCUMENTS

| | | | |
|---|---|---|---|
| 4,492,940 | 1/1985 | Hikita | 333/195 |
| 4,647,881 | 3/1987 | Mitsutsuka | 333/153 |
| 4,649,357 | 3/1987 | Nagai et al. | 333/196 |

FOREIGN PATENT DOCUMENTS

| | | | |
|---|---|---|---|
| 0252704 | 11/1986 | Japan | 333/193 |
| 0253712 | 10/1988 | Japan | 333/193 |

Primary Examiner—Mark O. Budd
Assistant Examiner—Thomas M. Dougherty
Attorney, Agent, or Firm—Staas & Halsey

[57] ABSTRACT

A SAW device comprises a substrate, input and output interdigital electrodes provided on the substrate alternately to form a row of electrodes, and a pair of open strip reflectors disposed at both ends of the row, the input interdigital electrodes having a first pair number representing the number of pairs of opposing finger electrodes forming the input electrode, the output interdigital electrodes having a second pair number representing the number of pairs of opposing finger electrodes forming the output electrode, wherein the first pair number and second pair number are set different in the adjacent input and output electrodes with a predetermined ratio therebetween, the first pair number is changed in each input electrodes in the row, and the second pair number is changed in each output electrodes in the row.

15 Claims, 27 Drawing Sheets

SURFACE-ACOUSTIC-WAVER FILTER HAVING A PLURALITY OF ELECTRODES

BACKGROUND OF THE INVENTION

The present invention generally relates to so-called surface-acoustic-waver devices having a plurality of electrodes, and in particular to the arrangement of input and output electrodes of such a surface-acoustic-wave device for optimizing the characteristics of the device.

Recently, the demand for increased operational speed of information processing apparatuses and communication apparatuses has caused the shift of frequency used for the carriers or signals to higher frequency regions. In correspondence to such a shift of the frequency band, filters capable of operating in such high frequency region are required. For this purpose, the surface-acoustic-wave (abbreviated hereinafter as SAW) devices such as SAW filters are used.

In view of expected developments in the future, particularly in the field of automobile telephones and portable telephones, efforts ar made to develop the SAW device having a sharp attenuation in the frequency region outside the pass-band while maintaining a uniform band-pass characteristic in the pass-band. By using the SAW device in place of the conventional dielectric filters, the size of the filter can be reduced to about 1/30 and the size of the telephone can be reduced accordingly.

A typical SAW device such as the SAW filter uses a piezoelectric substrate having large electromechanical coupling coefficients and small temperature coefficient of frequency. For example, a single crystal of $LiTaO_3$ is used widely. The crystal of $LiTaO_3$ is cut in a predetermined orientation, and interdigital electrodes are provided on the substrate as the input and output electrodes.

FIG. 1 shows the geometrical parameters characterizing a typical interdigital electrode.

Referring to FIG. 1, the electrode comprises a first part EL1 and a second part EL2 each having a number of fingers $f_1-f_n$ or $g_1-g_n$, wherein each finger has a width W and separated from adjacent fingers by a separation S. Designating the wavelength of the surface acoustic wave as $\lambda$, the width W and the separation S are generally set to satisfy the relation $W=S=\lambda/4$. Thereby, the pitch defined in FIG. 1 as P is set to $P=\lambda/2$. Further, the each finger in the electrode EL1 and each finger in the electrode EL2 are provided to form a uniform overlap as shown in FIG. 1. Such an electrode is called the uniform overlap electrode.

When forming a SAW filter having a central band pass frequency of 835 MHz, for example, the pitch P is set to 2.45 $\mu$m while the width W and the separation S are set to 1.23 $\mu$m in correspondence to the velocity of 4090 m/sec of the surface acoustic wave in the X-direction. It should be noted that the foregoing velocity provides the wavelength $\lambda$ of 4.9 $\mu$m for the surface acoustic wave of 835 MHz. Generally, a pair of such electrodes EL1 and EL2 are provided. In the particular applications of SAW devices such as automobile telephones or portable telephones, on the other hand, devices having a small insertion loss, a wide pass-band and a large suppression for the frequency components outside the pass band, are required. For example, an insertion loss of 3-5 dB or less, a pass band of 25 MHz or more and the side lobe suppression of 24-25 dB or more may be required for the SAW filter having the central frequency of 835 MHz.

In order to satisfy these various requirements, various proposals have been made, including the SAW device having the multiple electrode construction (Lewis, M., Ultrasonics Symposium Proceedings, p. 12, 1982).

FIGS. 2(A) and 2(B) show the block diagram of the multiple electrode SAW device, wherein FIG. 2(A) shows the case where an odd number of electrodes are provided and FIG. 2(B) shows the case where an even number of electrodes are provided.

In the drawings, the SAW device has a number of interdigital input electrodes 2 and a number of interdigital output electrodes 3 provided alternately on the same surface of the piezoelectric crystal (not shown). At both sides of the electrodes 2 and 3, a pair of reflectors 4 are provided, and the electrode 2 is connected to an input terminal 20, the electrode 3 to an output terminal 30.

In FIGS. 2(A) and 2(B), the number of pairs of finger electrodes that form the interdigital electrode is shown by oN for the output electrodes 3 and by iN for the input electrodes 2. Here, each pair of the finger electrodes includes one finger electrode such as the finger $f_2$ for the electrode EL2 and an adjacent, opposing finger electrode such as the finger $g_1$ for the opposing electrode EL1 shown in FIG. 1. FIG. 2(A) shows the SAW device having six input electrodes and five output electrodes while FIG. 2(B) shows the device having seven input electrodes and six output electrodes. In any of these, the input electrode 2 and the output electrode 3 are disposed alternately.

FIG. 3 shows the interdigital electrode forming the electrodes 2 and 3 of a conventional SAW device. As can be seen, this device has the six input electrodes 2 and five output electrodes 3.

Referring to FIG. 3, the device has a piezoelectric substrate 1, and the interdigital input and output electrodes 2 and 3 are provided on the upper major surface of the substrate 1 with a mutual separation d, where d represents the distance from the center of an input electrode 2 to the center of an adjacent output electrode 3. The reflector 4 has a so-called short circuit strip type wherein a number of electrode strips are shorted with each other at both ends thereof. For the simplicity, FIG. 3 shows the device that uses the uniformly overlapped electrode for the electrodes 2 and 3. The concept of "overlap" is defined in FIG. 1. It should be noted that FIG. 3 is a schematical drawing and the number of electrode fingers in each electrode or the number of electrode strips in the reflector is not depicted accurately.

In order to improve the characteristics of the SAW device of FIG. 3, various improvements and modifications are proposed. For example, the French patent 6911765 describes the so-called apodized electrodes wherein the overlap of the finger electrodes is changed in the input electrode 2 and the output electrode 3. On the other hand, the Japanese Laid-open patent application No. 50-40259 describes a decimated electrode construction wherein the finger electrodes in the interdigital electrode are given a weight distribution by selective removal of the finger electrode. Alternatively, there is a proposal in the Japanese Laid-open patent application No. 49-66051 in which the number of pairs of the electrode finger is changed.

FIG. 4 shows the band pass characteristic of such a multiple electrode SAW filter, wherein the vertical axis represents the attenuation or insertion loss and the horizontal axis represents the frequency. The SAW filter of this example is constructed on a 36°Y-X LiTaO$_3$ substrate and has seven input electrodes 2 and six output electrodes 3 both having the uniform overlap of the finger electrodes. The parameter iN, representing the number of opposing finger electrode pairs in the input electrode 2, is set at 19 (iN=19), while the number oN, representing the number of opposing finger electrode pairs in the output electrode 3 is set to 30 (oN=30). It should be noted that the concept of "the opposing electrode pair" used herein are defined in the schematic illustration of FIG. 1. On the other hand, the reflector 4 is constructed from 30 pairs of electrode strips shorted at both sides thereof.

In the characteristic of FIG. 4, it can be seen that such a SAW filter has an extensive side lobe adjacent to the pass-band, and because of this, the out-of-band attenuation that can be reached by the present construction is limited to only 13 dB. Further, within the pass-band, one can see a large ripple or dip in the characteristic that should be as flat as possible in this region. In addition to the foregoing problems, the SAW filter of the conventional construction has a problem in that it cannot provide a sufficiently large pass-band that is desired for the applications such as automobile telephones, portable telephones and the like. It should be noted that, conventionally, dielectric filters have been used for this purpose. However, the dielectric filter, having has a large size, has caused a problem in reducing the size of the apparatuses.

SUMMARY OF INVENTION

Accordingly, it is a general object of the present invention to provide a novel and useful SAW device wherein the foregoing problems are eliminated.

Another and more specific object of the present invention is to provide a SAW device having a large attenuation outside the pass-band.

Another object of the present invention is to provide a SAW device having a flat transmission characteristic in the pass-band.

Another object of the present invention is to provide a SAW device having an increased pass-band frequency range.

Another object of the present invention is to provide a SAW device comprising a piezoelectric substrate, a plurality of interdigital input and output electrodes of uniform finger electrode overlap for each of the input and output electrodes, said input electrode and output electrode being aligned in a predetermined direction on a top surface of the piezoelectric substrate alternately to form a row, and a pair of reflectors one provided in correspondence to a first end of the row and one in correspondence to a second, opposing end of the row, each interdigital electrode having a number of opposing finger electrodes disposed alternately with a uniform overlap, wherein the number of opposing pairs of the finger electrode in one input electrode is different from the number of opposing pairs of the finger electrode in the adjacent output electrodes, the number of opposing pairs of finger electrode in the input electrode is changed in each input electrode, and the number of opposing pairs of finger electrode in the output electrode is changed in each output electrode. The present invention particularly provides an optimum construction wherein a ratio (Γ) between the number of opposing finger electrode pairs in the input electrode (iN) to the number of opposing finger electrode pairs in the output electrode (oN) is set to a value of 0.73±0.1 (Γ=iN/oN=0.73 ±0.1), and wherein the number of the opposing finger electrode pairs for the output electrode is decreased from a central part of the row toward the both ends thereof while maintaining a relationship $\alpha = [(oN^0 - oN^m)/oN^0 . m] = \pm(0.07 \pm 0.01)$. According to the present invention, a SAW filter having a stringent suppression of out-of-band frequency component is achieved while reducing the ripple in the pass-band.

Another object of the present invention is to provide a SAW device having a piezoelectric substrate on which a plurality of input electrodes each having an interdigital construction and a plurality of output electrodes each having also an interdigital construction are provided alternately, with a pair of striptype reflectors disposed at both ends of the interdigital electrodes, wherein the regions of the piezoelectric substrate on which the output interdigital electrodes are provided, are grooved except for the part covered by the finger electrode forming the interdigital electrode.

Another object of the present invention is to provide a SAW device having a piezoelectric substrate on which a plurality of input electrodes each having an interdigital construction and a plurality of output electrodes each having also an interdigital construction, are provided alternately, with a pair of strip type reflectors disposed at both ends of the interdigital electrodes, wherein the output interdigital electrodes are provided with an additional layer in each finger electrode forming the interdigital electrode. According to the present invention, the impulse response that causes the dip or ripple in the pass band is improved by adjusting the timing of the reflection waves reflected back from the reflectors, by the modified inertia of the finger of the interdigital electrodes. Thereby, a further improvement in the passband can be achieved.

Other objects and further features of the present invention will become apparent from the following detailed description when read in conjunction with the attached drawings.

BRIEF DESCRIPTION OF THE DRAWINGS

FIGS. 8(A) through 9(C) are diagrams showing various layouts of the electrodes of the SAW device used by the present invention;

DETAILED DESCRIPTION

First, the principle of the present invention will be described.

Generally, the transfer function $H(\omega)$ of a SAW device is represented as $$H(\infty) \omega \sin(iN\pi X)/iN\pi X \cdot \sin(oN\pi X)/oN\pi X$$

where $iN$ represents the number of pairs of the opposing fingers in the input interdigital electrode, $oN$ represents the number of pairs of the opposing fingers of the output interdigital electrode, and $X$ is defined as $X = (f - f_o)/f_o$, where $f_o$ designates the resonant frequency determined by the parameter $\lambda$ of the finger electrodes.

Figure 5:
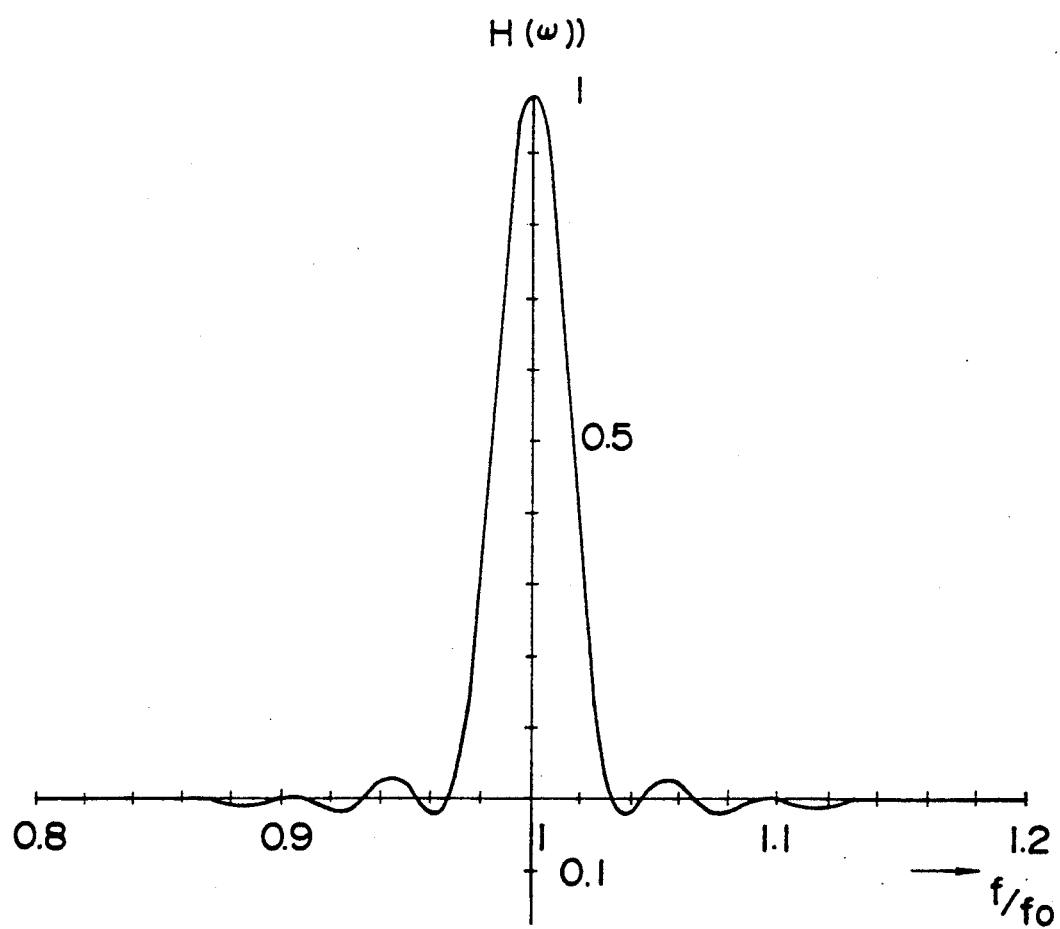
FIGS. 5 and 6 are diagrams respectively showing the transfer function and a corresponding frequency characteristic of a simplified SAW filter having a plurality of input and output electrodes for explaining the of the present invention.
Figure 6:
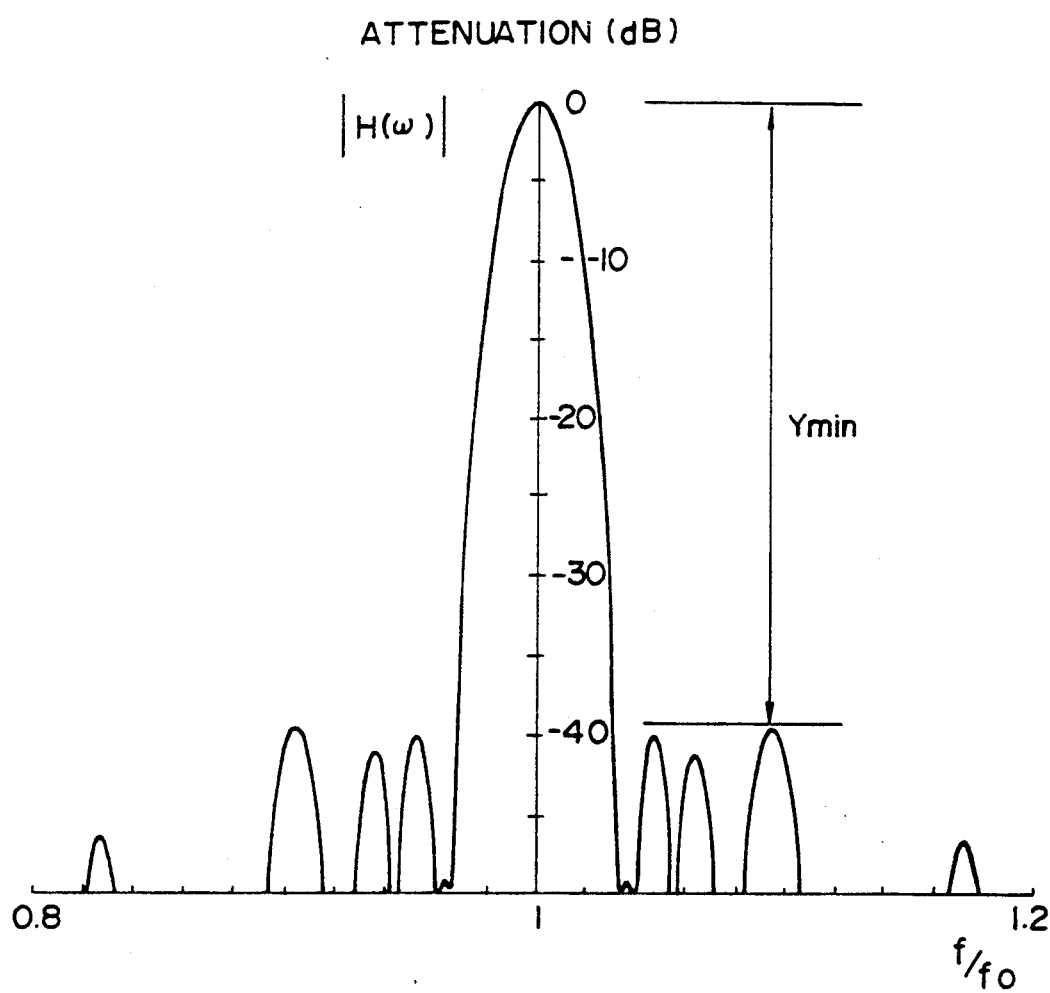

FIG. 5 shows the plot of the transfer function $H(\omega)$ for the case where $iN = 22$ and $oN = 30$, where $H(\omega)$ is normalized against the frequency $f_o$ corresponding to $X = 0$, and FIG. 6 shows the corresponding frequency characteristic of the SAW filter. In FIG. 6, the absolute value of the transfer function $H(\omega)$ is plotted in the logarithmic scale.

Figure 7A:
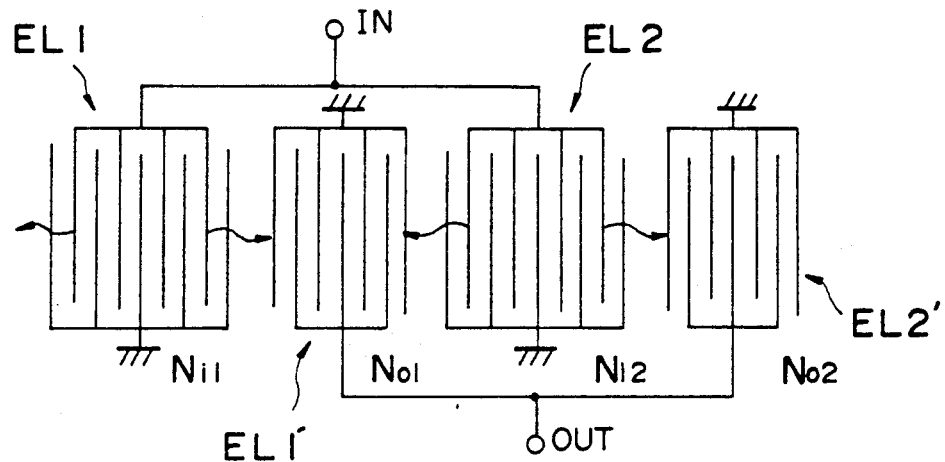
FIGS. 7(A) and 7(B) are diagrams showing the simplified construction of the interdigital electrodes on the SAW device for explaining the principle of the present invention.
Figure 7B:
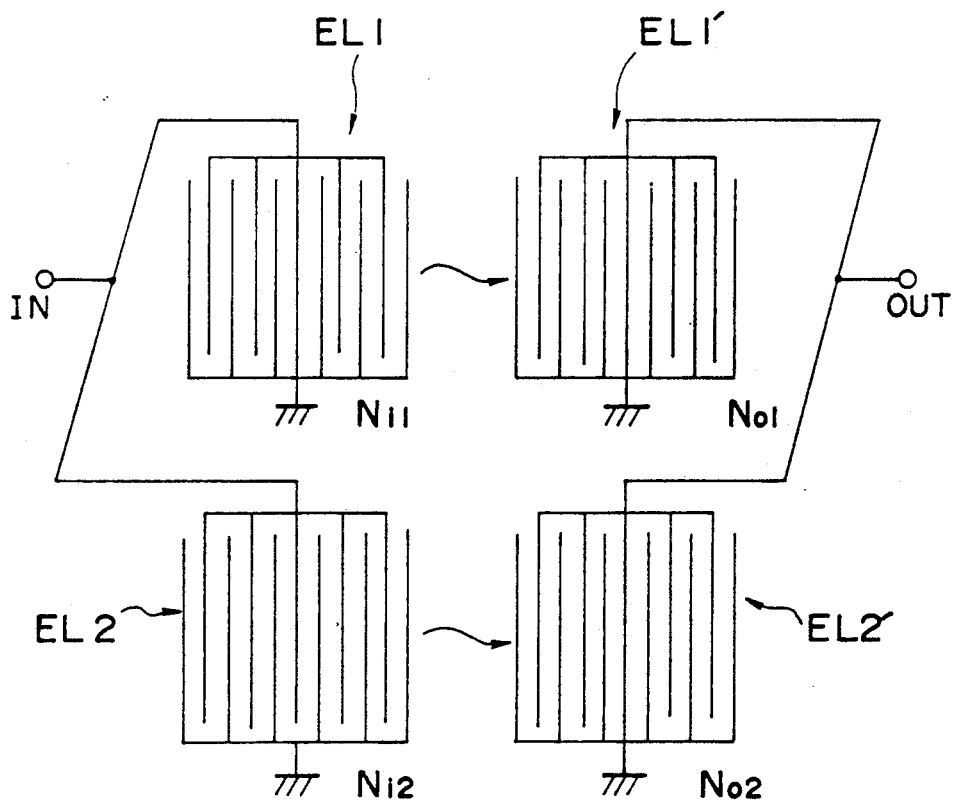

In the case where a pair of input interdigital electrodes EL1 and EL1' and a pair of corresponding output interdigital electrodes EL2 and EL2' are connected in parallel in correspondence to the arrangement of FIG. 7(A) or FIG. 7(B), the transfer function is represented as $$H(\omega) = \sin(iN^1\pi X)/iN^1\pi X \cdot \sin(oN^1\pi X)/oN^1 + \sin(iN^2\pi X)/iN^2\pi X \cdot \sin(oN^2\pi X)/oN^2\pi X$$

wherein $iN^1$ and $oN^1$ represent respectively the number of pairs of the opposing fingers in the input electrode EL1 and the output electrode EL1', while $iN^2$ and $oN^2$ represent respectively the number of pairs of the opposing fingers in the input electrode EL2 and the corresponding output electrode EL2'.

Figure 8A:
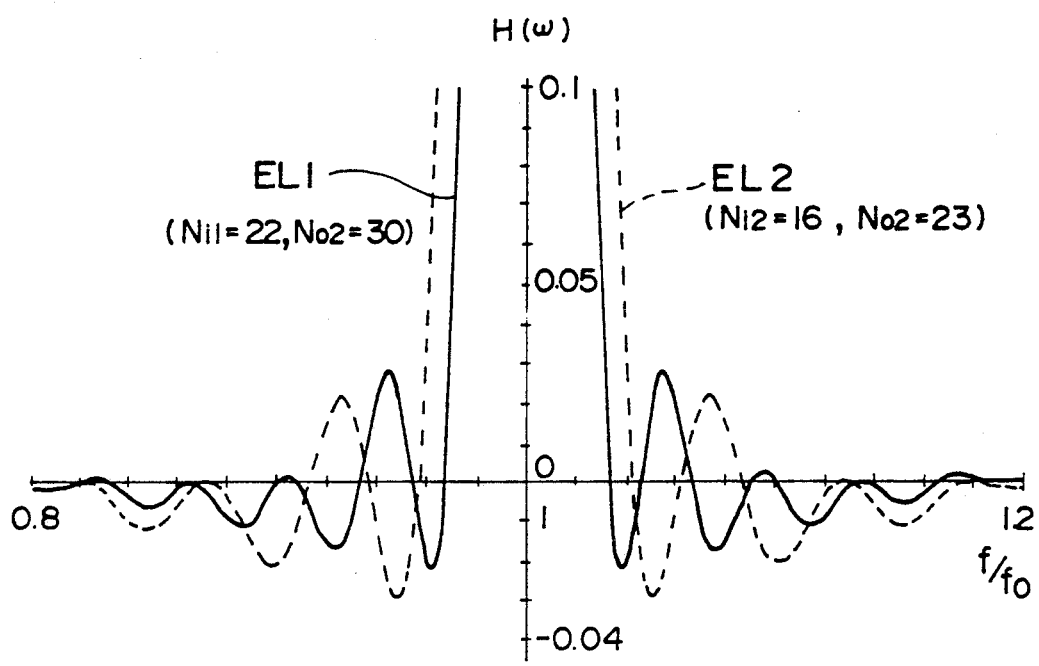
FIGS. 8(A) and 8(B) are graphs showing the cancellation of the side lobes achieved by the present invention.
Figure 8B:
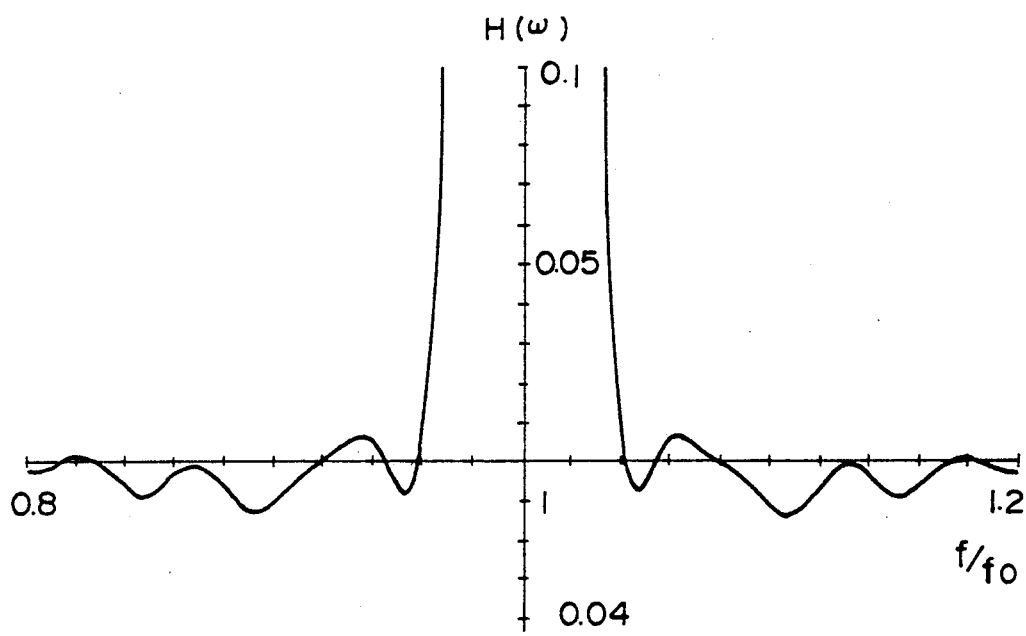

Here, the first term of the above representation of H($\omega$) gives a frequency characteristic with the peak in correspondence to X=0 as shown in FIG. 5, and the second term gives another frequency characteristic analogous to FIG. 5 with the peak also coincident to X=0. The difference between the first term and the second term corresponds to the difference in the side lobe shown in the diagram of FIG. 5. Thus, by suitably choosing $iN^1$, $oN^1$, $iN^2$ and $oN^2$, it is expected that the side lobes are canceled out in the first term and the second term as shown in FIGS. 8(A) and 8(B), where FIG. 8(A) shows the H($\omega$) for the first term by the continuous line and FIG. 8(B) shows the H($\omega$) for the second term by the broken line. After the cancellation, the H($\omega$) plotted in FIG. 8(B) is obtained.

FIGS. 8(A) and 8(B) show the SAW device that satisfies the relationship $iN^1=22$, $oN^1=30$, $iN^2=16$ and $On^2=23$. In this device, the ratio $iN^1/oN^1 \approx iN^2/oN^2 \approx 0.70$ is maintained to maintain the similarity in the form of the H($\omega$) function for the first and second terms. Otherwise, the undulating slope of the H($\omega$) for the first term would be significantly different from the undulating slope of H($\omega$) of the second term and the cancellation of the side lobe will not be achieved as desired. By the foregoing improvement, the magnitude of the side lob is decreased by about 6 dB.

In principle, the minimization of the side lobe in the SAW filter of the multiple electrode construction can be achieved by finding out the set of parameters of the function H($\omega$) defined as $$H(\omega) = \sum_{n=1}^{n=M} \sin(iN^n\pi X)/iN^n\pi X \cdot \sin(oN^n\pi X)/oN^n\pi X.$$

that minimizes the side lobe. In other words, the set of parameters $in^n$ and $oN^n$ (n=1, ... M) that minimizes the side lobe in the function H($\omega$) provides the necessary solution. However, the above equation does not include the effect of reflections and transmission of the acoustic waves at the edge of the electrodes and cannot be applied for the analysis of the actual device. Further, the above equation contains numerous variables and the seeking for the minimum of H($\omega$) by the analytical approach is extremely difficult.

Accordingly, the inventors have developed a simulation tool for the above purpose, based on the equivalent circuit theory of Smith (W. R. Smith, et al., IEEE Tfans. on MTT, vol.MTT-20, no. 7, p. 458, 1972).

In this approach, the electromechanical behavior of the interdigital electrode on the piezoelectric body is represented by a four-terminal network having mechanical input terminals 1 and 2, corresponding mechanical output terminals 1' and 2', electrical input terminals 3 and 4, and corresponding electrical output terminals 3' and 4', of which response is represented by the following 4×4 transfer matrix (F-matrix):

$$\begin{bmatrix} e_1 \\ i_1 \\ e_3 \\ i_3 \end{bmatrix} = \tag{1}$$

$$\begin{bmatrix} S_A & jZ_oS_B & r_n(1-S_A) & 0 \\ jS_C/Z_o & S_A & jr_nS_C/Z_o & 0 \\ 0 & 0 & 1 & 0 \\ -jr_n \cdot S_C/Z_o & r_n(1-S_A) & j(C_o+r_n \cdot S_C/Z_o) & 1 \end{bmatrix} \begin{bmatrix} e_2 \\ i_2 \\ e_4 \\ i_4 \end{bmatrix}$$

were $e_1$ and $i_1$ represent the equivalent voltage and current corresponding to the acoustic wave pressure and particle velocity supplied to the mechanical input terminals 1 and 2, $e_2$ and $i_2$ represent the corresponding equivalent voltage and current that are obtained from the mechanical output terminals 1' and 2', $e_3$ and $i_3$ are the voltage and current applied to the interdigital electrode and supplied to the electrical input terminals 3 and 4 of the network, and $e_4$ and $i_4$ are the voltage and current obtained at the electrical output terminals 3' and 4' of the network and represent the voltage and current obtained at the interdigital electrode.

In the foregoing matrix, the parameters forming the coefficients are defined as follows.

$S_A = \cos(\theta_m)\cdot\cos(\theta_g) - [(q^2+1)/2q]\cdot\sin(\theta_m)\cdot\sin(\theta_g)$ $S_B = \cos(\theta_m)\cdot\cos(\theta_g) + \sin(\theta_m)\cdot(a-q^2d)/q$ $S_C = \cos(\theta_m)\cdot\cos(\theta_g) + \sin(\theta_m)\cdot(q^2a-d)/q$ $a = Z_o/Z_m = V_g/V_m = 1+k^2/2$ $a = \cos^2(\theta_g/2)$ $d = \sin^2(\theta_g/2)$ $r^n = (-1)^2 SQRT(2f_o C_o k^n Z_o)$ $C_o = \epsilon_o SQRT(\epsilon_{11}\cdot\epsilon_{33})/2,$ where $C_o$ represents the capacitance per single finger electrode, $Z_0$ represents the acoustic impedance of free surface, $Z_m$ represents the acoustic impedance under the electrode, $V_g$ represents the acoustic wave velocity at the free surface, $V_m$ represents the acoustic wave velocity under the electrode, $\theta_g$ represents the phase rotation of the acoustic wave under the free surface and represented as $\theta_g = [(k^2+2)/(k^2+4)]\cdot(\pi f/f_o),$ $\theta_m$ represents the phase rotation of the acoustic wave under the electrode and represented as $\theta_m = [2/(k^2+4)]\cdot(\pi f/f_o),$ $k^2$ represents the electromechanical coupling factor and assumes a value of 0.05 when the substrate is a single crystal of 36°Y-XLiTaO$_3$, and $f_o$ represents the resonant frequency determined by the period $\lambda_o$ of the interdigital electrode and represented as $V_g/\lambda_o$.

Based upon the foregoing 4×4 transfer matrix, a representation is obtained for the system wherein the input electrodes, output electrodes, reflectors and the SAW propagation path are included. Further, the electrical terminals of the input electrodes, output electrodes and the reflectors are separated from the rest of the system. Thereby, the system is represented by a ten-terminal network having the F-matrix with 10×10 elements. It should be noted that Eq.(1) represents the function H(ω) for the input electrode alone. In the actual SAW device, there are provided an output electrode and two reflectors in addition to the input electrode, and because of this, two additional electric terminals are added for the output electrode together with four electric terminals for the two reflectors. Thereby, the number of terminals becomes to be ten and the F-matrix has the 10×10 elements.

Further, by setting an appropriate load condition, the foregoing system is converted to a two terminal network having a pair of input terminals and a pair of output terminals, with the F-matrix of 2×2 construction, with the matrix elements of A, B, C and D that are defined as a function of frequency (Satoh, Y. et al., "SAW filter of 800 MHz band employing a weighting method for the number of finger pairs", ABSTRACT, 19th EM SYMPOSIUM, PP. 29–34, May, 11, 1990, which is incorporated herein as reference). The following equation represents the transmission characteristics of this system.

$$S_{21} = 2 \cdot SQRT(R_{in} \cdot R_{out})/(A \cdot R_{out} + B + C \cdot R_{in} \cdot R_{out} + D \cdot R_{in}), \quad (2)$$

where $R_{in}$ represents the source impedance and $R_{out}$ represents the load impedance.

In the present invention, extensive simulation has been undertaken using the foregoing Eq. (2) as the simulation tool, and the optimum condition where the suppression of the side lobe is most efficient is searched. Further, in order to confirm the result of simulation, the samples of SAW devices are produced and tested.

Hereinafter, the embodiments of the present invention will be described.

Figure 9A:
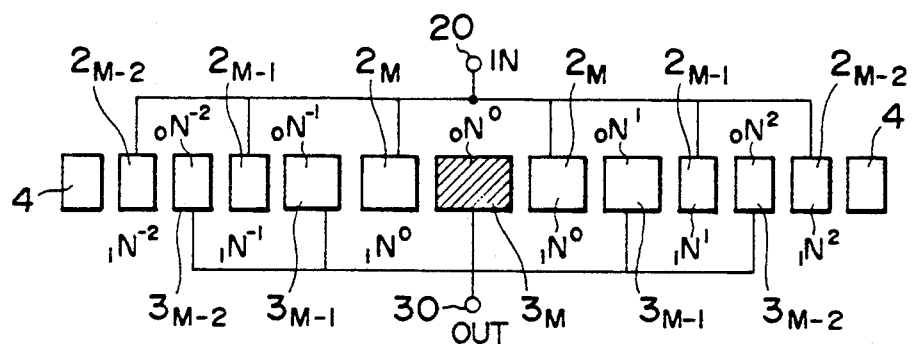
Figure 9B:
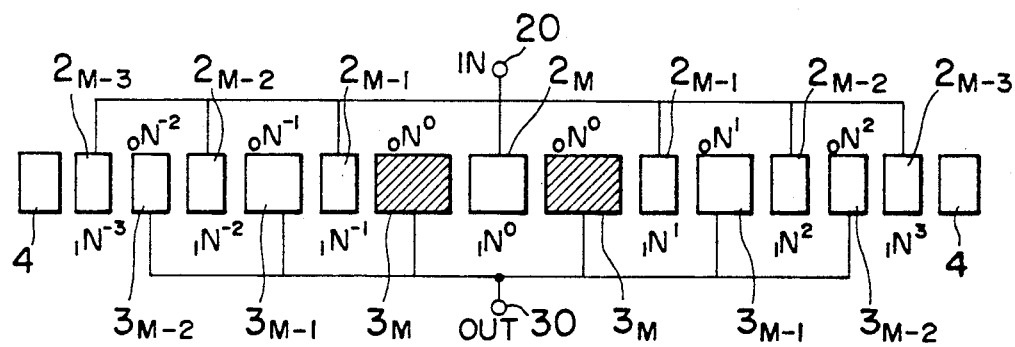
Figure 9C:
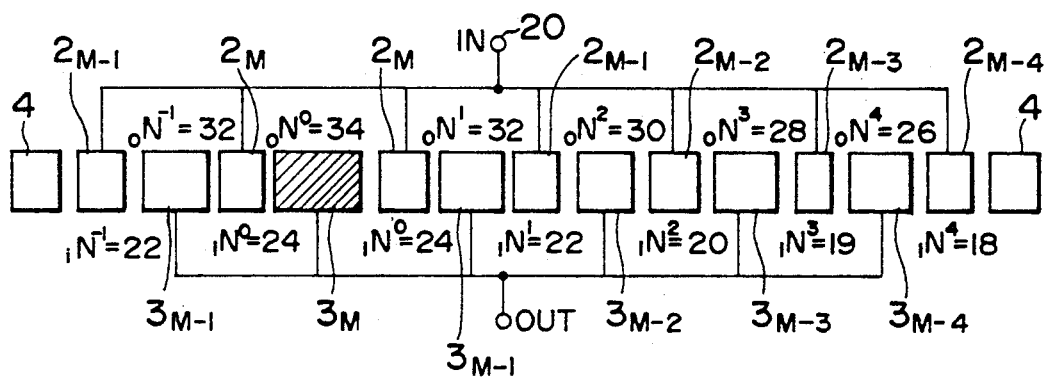

FIGS. 9(A)–9(C) are the block diagrams that show the fundamental construction of the SAW device according to the present invention, wherein FIG. 9(A) shows the case where five output electrodes $3_M$, $3_{M-1}$ and $3_{M-2}$ are used in combination with six input electrodes $2_M$, $2_{M-1}$ and $2_{M-2}$ such that the input and output electrodes are disposed symmetric about the central output electrode $3_M$ shown by the hatching. FIG. 9(B) shows the case where six output electrodes $3_M$, $3_{M-1}$, $3_{M-2}$ and $3_{M-3}$ are used in combination with seven input electrodes $2_M$, $2_{M-1}$, $2_{M-2}$ and $2_{M-3}$ such that the input electrodes and output electrodes are disposed symmetric about a central input electrode $iN^0$. Further, FIG. 9(C) shows the case wherein an six output electrodes $3_M$, $3_{M-1}$, $3_{M-2}$ and $3_{M-3}$ are used in combination with an seven input electrodes $2_M$, $2_{M-1}$, $2_{M-2}$ and $2_{M-3}$ such that the input and output electrodes are arranged generally asymmetric. In FIGS. 9(A)–9(C), the electrode designated by the reference numeral 4 represents a reflector.

Figure 1:
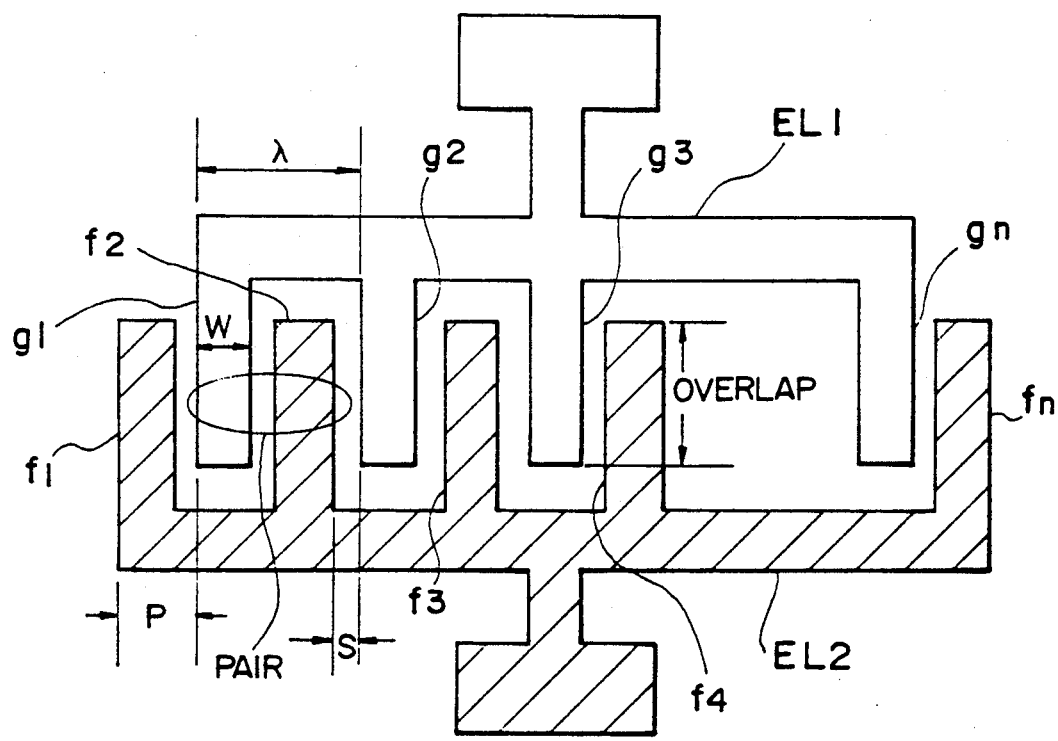
FIG. 1 is a diagram showing various geometrical parameters of a typical interdigital electrode used for a SAW device.
Figure 2A:
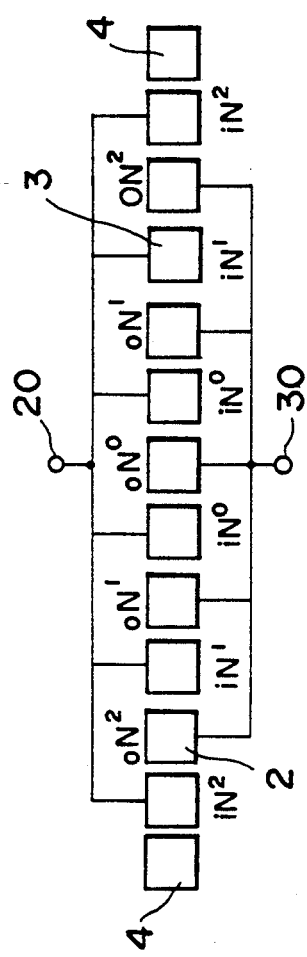
FIGS. 2(A) and 2(B) are diagrams showing the arrangement of electrodes on a SAW device schematically.
Figure 2B:
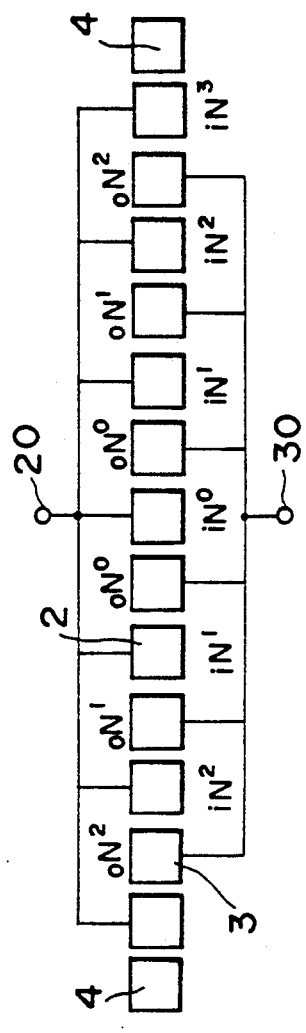
Figure 3:
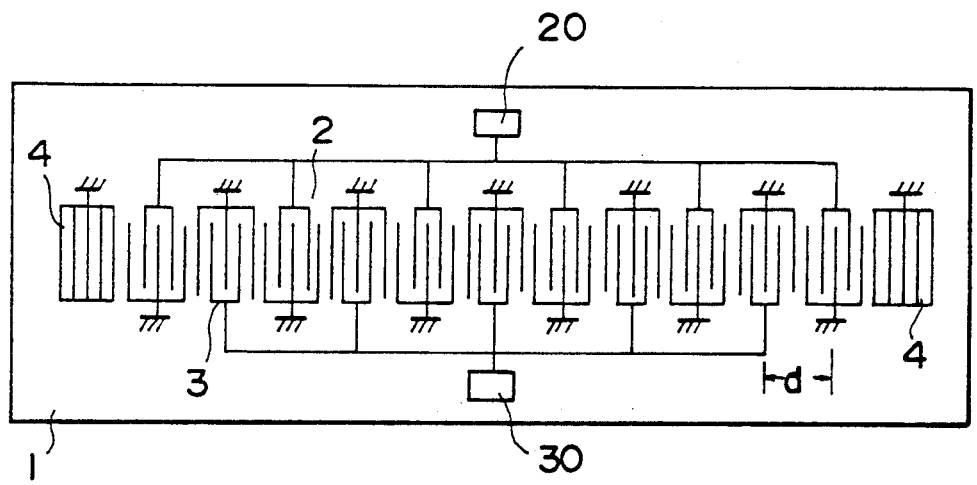
FIG. 3 is a diagram showing the conventional interdigital electrodes and reflectors provided on a SAW device.

In FIGS. 9(A)–9(C), it should be noted that the output electrode that has the largest number of pairs of opposing fingers (about the definition of "pair", see the illustration of FIG. 1) is designated as $3_M$ and represented by the hatching. Here, it is important to note that, in order to achieve the cancellation of the side lobe discussed with reference to FIGS. 8(A) and (8B), the output electrodes $3_{M-1}$, $3_{M-2}$, $3_{M-3}$, ... at both sides of the foregoing electrode $3_M$ should have the number of pairs of opposing fingers, $oN^1$, $oN^2$, $oN^3$, ... of which number may remain constant or decreased successively with increasing distance from the electrode $3_M$ ($oN^0 \geq oN^1 \geq oN^2 \geq oN^3, \ldots$).

Similarly, the input electrodes $2_M$ that are located at both sides of the output electrode $3_M$ also have the largest number of pairs $iN^0$ among the input electrodes, and the input electrodes $2_{M-1}$, $2_{M-2}$, $2_{M-3}$, ... located laterally at both sides of the electrodes $2_M$ have the number of pairs $iN^1$, $iB^2$, $iN^3$, that may decrease with increasing distance from the input electrode $2_M$ ($iN^1 \geq iN^2 \geq iN^3, \ldots$). Further, each input electrode such as the electrode $2_M$ has the number of pairs that is different from the number of pairs of the corresponding output electrode such as the electrode $3_M$. Thus, $iN^0 \neq oN^0$, $iN^1 \neq oN^1$, $iN^2 \neq oN^2$, ....

Figure 10:
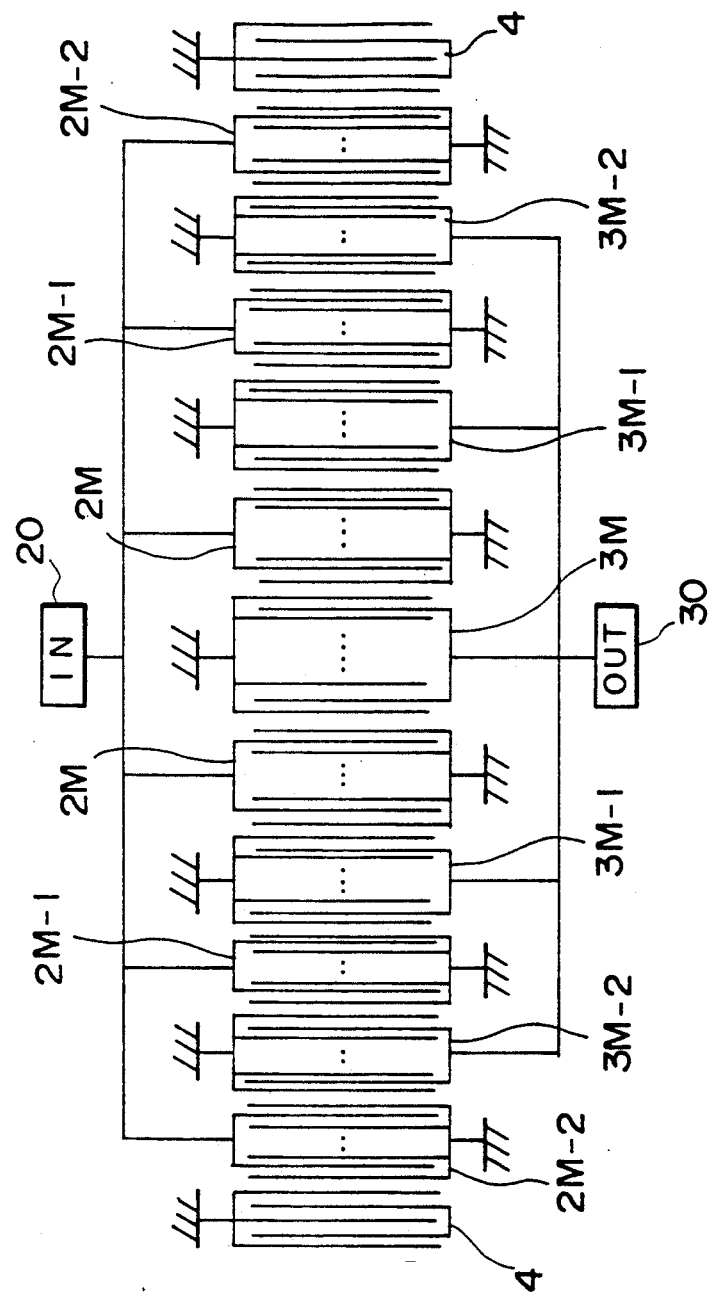
FIG. 10 is a diagram showing the construction of the electrode used in the SAW device of the present invention and showing the fundamental feature of the present invention.

FIG. 10 schematically shows the electrodes $2_M$, $2_{M-1}$, $2_{M-2}$, $3_M$, $3_{M-1}$ and $3_{M-2}$ of FIG. 9(A). This drawing shows the decrease of the pair of finger electrodes from the central part to the lateral edge of the device.

Figure 11:
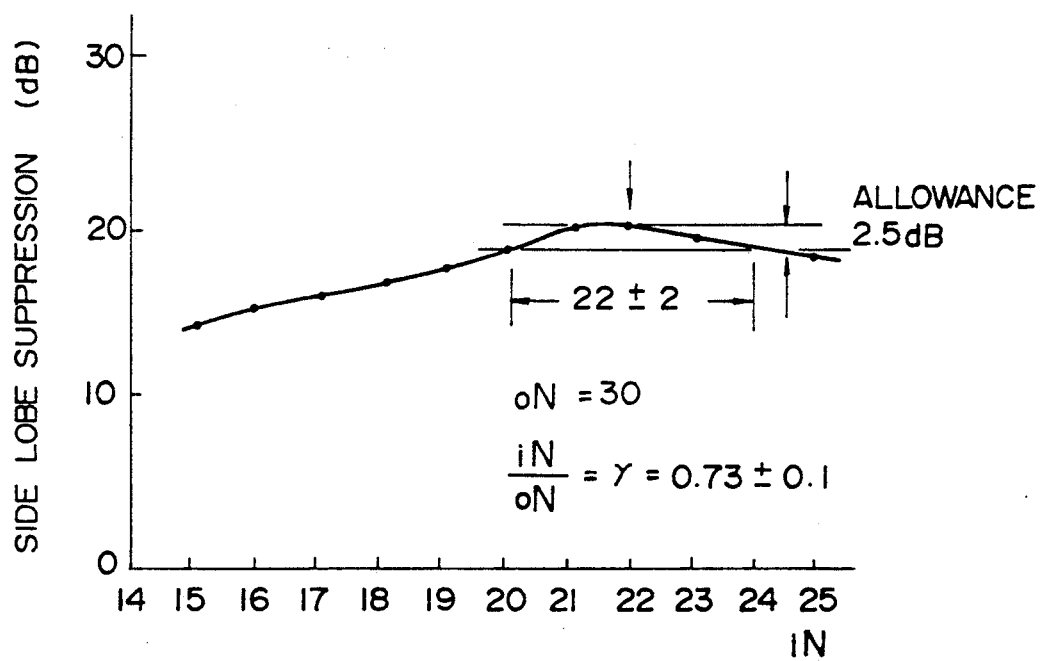
FIG. 11 is a graph showing the principle of the first embodiment wherein the side lobe suppression is achieved by optimizing the number of finger pairs in the input electrodes with respect to the number of finger pairs of the output electrodes.

FIG. 11 shows the result of simulation undertaken for the SAW device of FIG. 10. In this simulation, all the parameters $oN^0$, $oN^1$, $oN^2$, are fixed at $oN$, all the parameters $iN^0$, $iN^1$, $iN^1$ are set equal to $iN$, and the condition that gives the maximum side lobe suppression is searched for by setting the parameter $oN$ to 30 ($oN = 30$) while changing the value of the parameter $iN$.

As can be seen from this result of simulation, a range $iN$ of between 20 and 24 has been found with the maximum side lobe suppression of 20 dB, wherein the preferable range is determined to be $22 \pm 2$ with corresponding tolerance of side lobe suppression of 2.5 dB.

Figure 12:
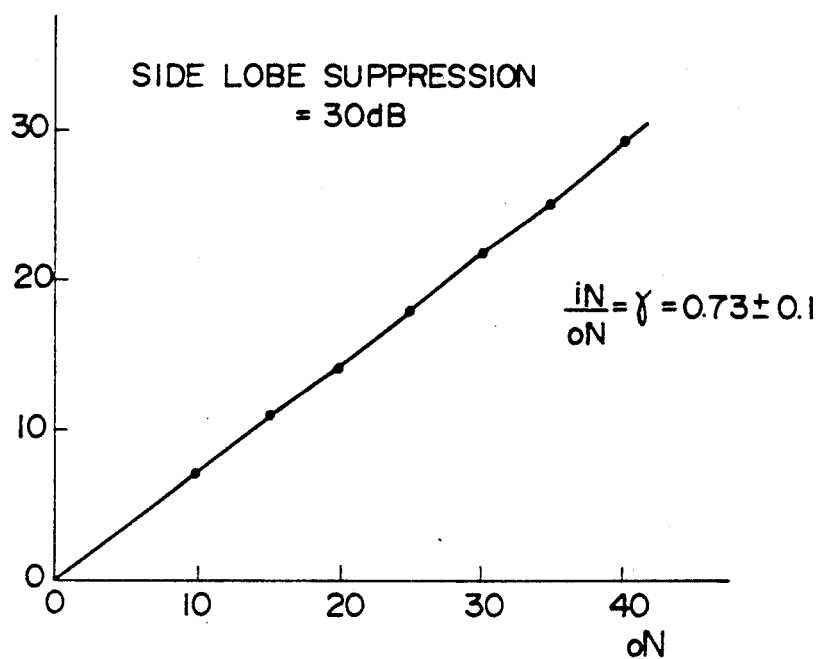
FIG. 12 is another graph showing the principle of the first embodiment wherein the number of pairs of the finger electrodes in the input electrodes and the number of pairs of in the output electrodes are optimized.

FIG. 12 is a diagram showing the optimum relationship between the parameter $iN$ and the parameter $oN$ found out as a result of simulation. In contrast to the simulation of FIG. 11, the parameter $oN$ is not fixed at 30 in this simulation but changed variously together with the parameter $iN$ and the optimum condition that gives the side lobe suppression of more than 22 dB is represented generally by a line having the slope Γ of $0.73 \pm 0.1$ or $$\Gamma = 0.73 \pm 0.07 \quad (3)$$

with the tolerance of 2 dB for the side lobe suppression.

Based upon the foregoing finding, the applicant of the present invention has prepared a specimen of SAW device according to a first embodiment of the present invention, wherein the SAW device is constructed on a 36°Y-X LiTaO$_3$ single crystal substrate having a thickness of 0.5 mm, a width of 1.2 mm and a length of 2.2 mm. The interdigital electrodes $2_M$, $2_{M-1}$, $2_{M-2}$, $3_M$, $3_{M-1}$, $3_{M-2}$, are formed on the upper major surface of the substrate by first sputtering an Al-Cu alloy layer with a thickness of 170 nm and patterning the deposited alloy layer such that each finger of the interdigital electrode has the width W and the separation S (see FIG. 1) of 1.2 μm in correspondence to λ/4 of the surface acoustic wave having the frequency of 836 MHz. It should be noted that the substrate 1 of 36°Y-X LiTaO$_3$ has the surface acoustic wave velocity of 4090 m/sec and thus, the surface acoustic wave has the wavelength of 4.9 μm on this substrate.

Thus, the SAW device of the present embodiment is designed for passing the surface acoustic wave with the central frequency of of 836 MHz. In correspondence to this, the pitch P is set to 2.4 μm in correspondence to λ/2. The formation process of the electrode is well known and the description thereof will be omitted.

The fabricated SAW device has 7 input electrodes and 6 output electrodes as shown in FIG. 9(B), wherein the number of pairs of the fingers iN of the input electrodes is set to 22 (iN=22) throughout the input electrodes $2_{M}$-$2_{M\text{-}3}$ in correspondence to the finding of FIG. 11. On the other hand, the number oN of the six output eleotrodes $3_{M\text{-}1}$-$3_{M\text{-}3}$ is set to 30 throughout (oN=30). Thereby, the ratio Γ of the parameter iN to the parameter oN (Γ=iN/oN) is set to 0.73. Further, in this embodiment, the separation d between the center of an output electrode and the center of an input electrode is set to satisfy a relationship $d=(n+0.25).\lambda$, where n is a positive integer. The reflector 4 at both sides of the electrodes, on the other hand, is formed to have an open-strip type having 30 pairs of electrode strips in each. As shown in FIG. 10, the open-strip type reflector comprises first and second groups of parallel fingers connected with each other at the root part thereof while the tip part of the finger kept free from connection, wherein the first group has the root part connected to the ground while the second group has the root part floating.

Figure 4:
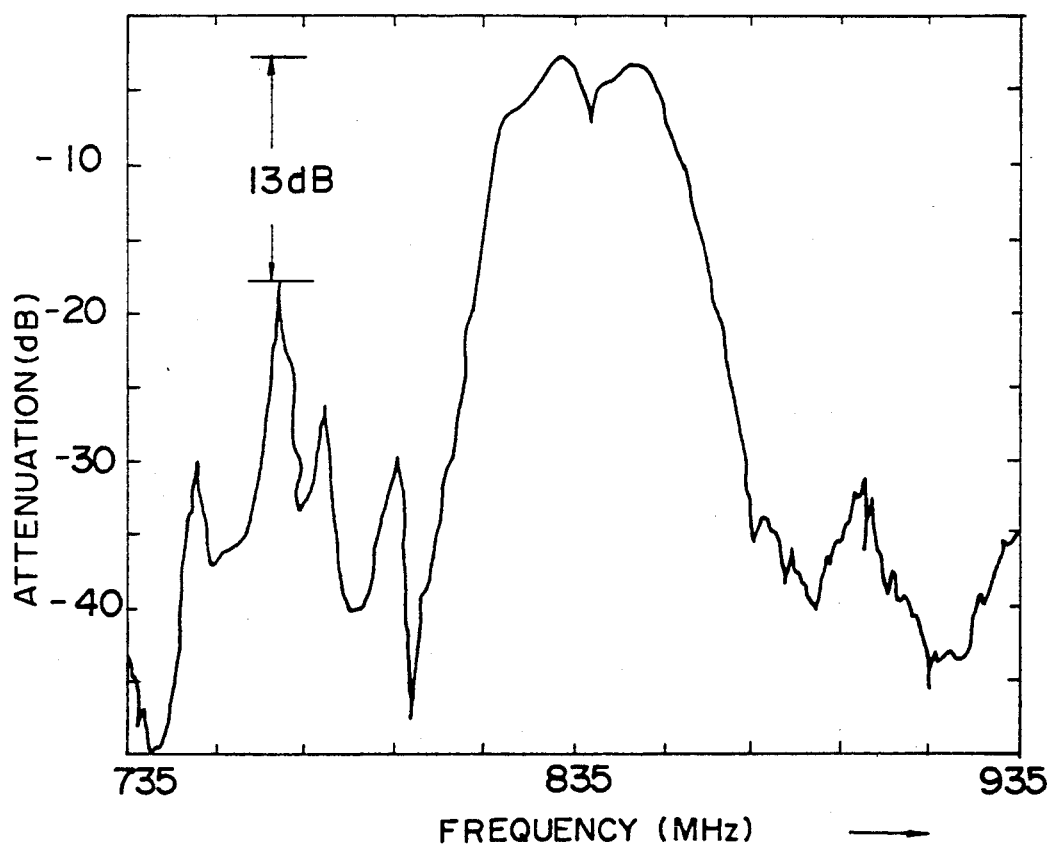
FIG. 4 is a graph showing the frequency characteristic of a typical conventional SAW filter.
Figure 13:
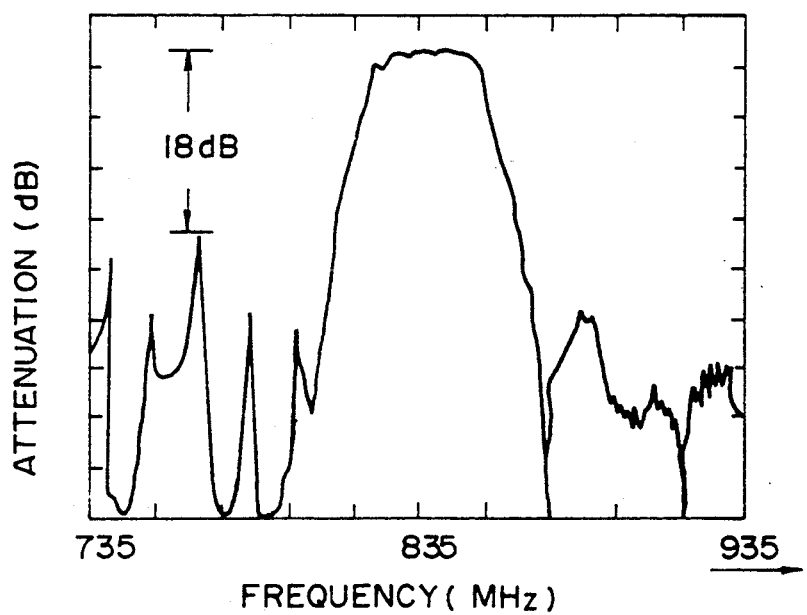
FIG. 13 is a frequency characteristic of the SAW device according to the first embodiment.

FIG. 13 shows the frequency characteristic obtained for the SAW device of the present embodiment. As compared with the corresponding characteristic diagram of FIG. 4, it can be seen that the side lobe suppression of the side lobe is significantly improved, from 13 dB to 18 dB. Further, the band pass characteristic is improved also as shown in the reduced ripple or dip in the pass-band. On the other hand, the passband and the out-of-band rejection achieved by the present embodiment are still unsatisfactory.

Next, a second embodiment of the present invention will be described. As the basic structure of the SAW device of this embodiment is substantially identical, the structural description will be omitted.

In this embodiment, the parameter oN representing the number of pairs of the fingers in the output electrodes $3_{M\text{-}1}$-$3_{M\text{-}3}$ is changed gradually from the central electrode toward the lateral sides. Thus, the number of pairs changes from $oN^0$, $oN^1$ and $oN^2$ in the electrodes $3_M$, $3_{M\text{-}1}$ and $3_{M\text{-}2}$, respectively, where the parameter $oN^1$ represents the maximum and the parameter $oN^2$ represents the minimum. On the other hand, the relation Γ=0.73±0.06 is maintained. This means that the parameters iN are changed also in correspondence thereto as $iN^0$, $iN^1$, $iN^2$ and $iN^3$ in correspondence to the electrodes $2_M$, $2_{M\text{-}1}$, $2_{M\text{-}2}$ and $2_{M\text{-}3}$ In the present embodiment, the parameters are set as follows.

$oN^0=30$, $oN^1=28$, $oN^2=26$, and $iN^o=22$, $iN^1=20$, $iN^2=19$, $iN^3=19$

Here, the parameter α is defined as $$\alpha=\pm(oN^0-oN^m)/oN^0.m \quad (4)$$

This parameter o represents the rate of decrease of the number of pairs of the fingers, and the parameter m is a positive integer. In the foregoing set, the parameter α assumes a value of 0.07.

Figure 14:
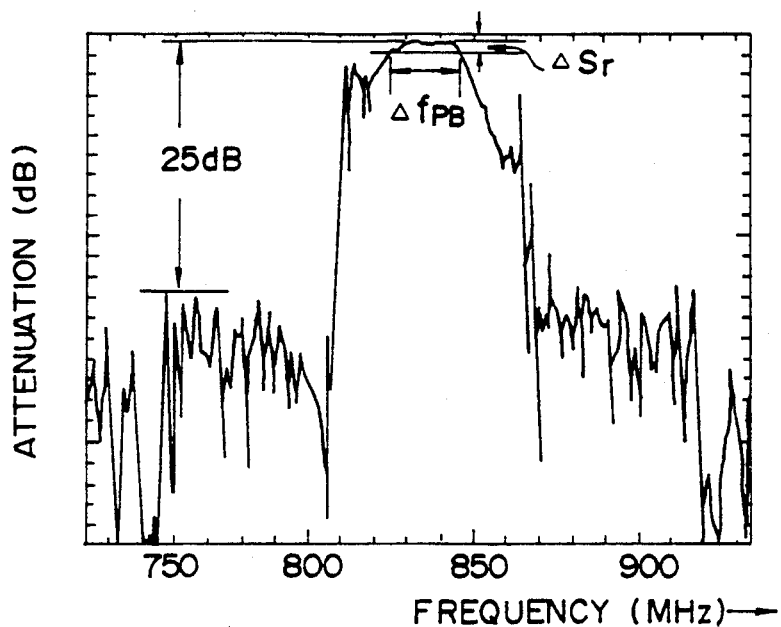
FIG. 14 is a frequency characteristic obtained by the simulation for the SAW device according to a second embodiment of the present invention.
Figure 15:
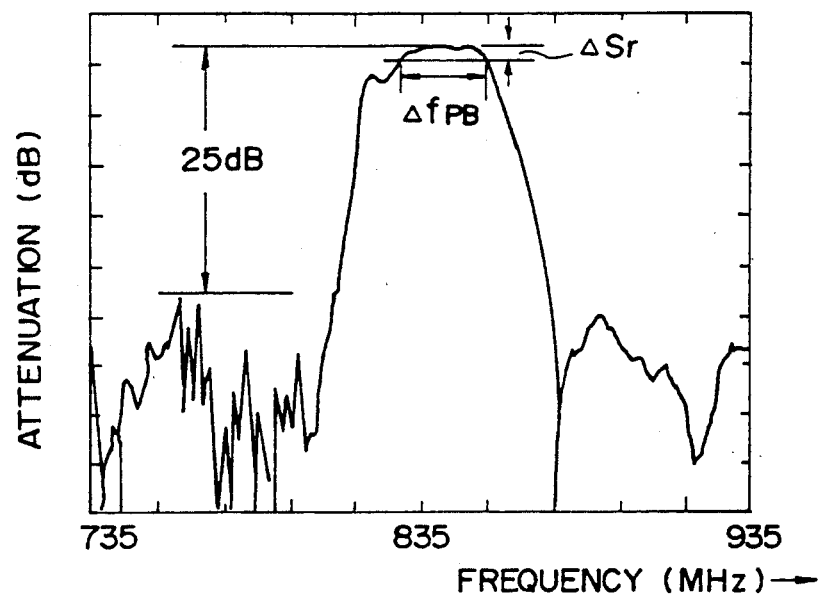
FIG. 15 is a frequency characteristic that was observed for the SAW device according to the second embodiment of the present invention.

FIG. 14 shows the result of simulation undertaken for the SAW device of the second embodiment and FIG. 15 is a characteristic diagram observed for the actually fabricated device. In the SAW device of the present embodiment, the material and size of the substrate is identical with the case of the first embodiment. Further, the formation of the interdigital electrodes is made similarly. Thus, the description about the structure of the SAW device for this embodiment will be omitted.

As can be seen in FIG. 14, the suppression of side lobe of 25 dB is achieved both in the simulation and in the experiment. Further, it can be seen that a pass-band designated as $\Delta f_{PB}$ in FIGS. 14 and 15 takes a range of about 25 MHz or more is achieved as will be examined later.

Next, a third embodiment of the present invention will be described, wherein the arrangement of the electrodes On the SAW device is made asymmetric. Q Referring to FIG. 9(C), the number of pairs of finger electrodes is changed asymmetric in the right branch and left branch of the electrodes. In this embodiment, the output electrode $3_M$ has the number of pairs $oN^0$ of 34 ($oN^0=34$), the output electrode $3_{M\text{-}1}$ at the right of the electrode $3_M$ has the number of pairs $oN^{+1}$ of 32 ($oN^{+1}=32$), the output electrode $3_{M\text{-}1}$ at the left of the electrode $3_M$ has the number of pairs $oN^{-1}$ also of 32 ($oN^{-1}=32$), the output electrode $3_{M\text{-}2}$ at the right of the electrode $3_{M\text{-}1}$ has the number of pairs $oN^{+2}$ of 30 ($oN^{+2}=30$), the electrode $3_{M\text{-}3}$ at the right of the electrode $3_{M\text{-}2}$ has the number of pairs $oN^{+3}$ of 28 ($oN^{+3}=28$), the electrode $3_{M\text{-}4}$ at the right of the electrode $3_{M\text{-}3}$ has a pair number $oN^{+4}$ of 18 ($oN^{+4}=18$).

In corresponding to this, the input electrode $2_M$ at both sides of the output electrode $3_M$ has the number of pairs $iN^0$ of 24 ($iN^032$ 24), the input electrode $2_{M\text{-}1}$ at the right of the output electrode $3_{M\text{-}1}$ has the number of pairs $iN^1$ of 22 ($iN^1=22$), the input electrode $2_{M\text{-}1}$ at the left of the electrodes $3_M$ and $2_M$ has the number of pairs $iN-1$ of 22 ($iN^{-1}=22$), the input electrode $2_{M\text{-}2}$ at the right of the output electrode $3_{M\text{-}2}$ has the number of pairs $iN^{+2}$ of 20 ($iN^{+2}=20$), the input electrode $2_{M\text{-}3}$ at the right of the output electrode $3_{M\text{-}3}$ has the number of pairs $iN^{+3}$ of 28 ($iN^{+3}=28$), and the input electrode $2_{M\text{-}4}$ at the right of the output electrode $3_{M\text{-}4}$ has the number of pairs $iN^{+4}$ of 18 ($iN^{+4}=18$).

Figure 16:
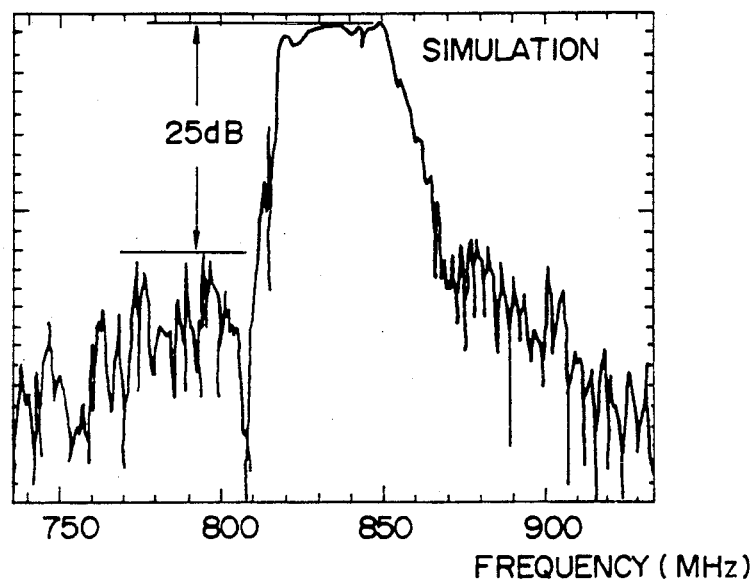
FIG. 16 is a frequency characteristic obtained by the simulation for the SAW device of a third embodiment for a different setting of the input and output electrodes.
Figure 17:
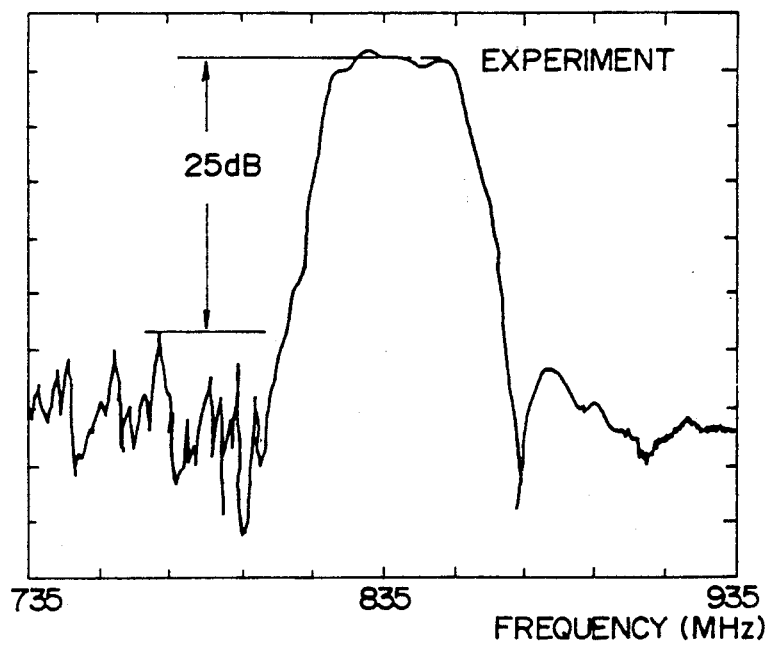
FIG. 17 is a frequency characteristic corresponding to FIG. 16 observed for the SAW device of the third embodiment.

FIG. 16 shows the result of simulation obtained for this device and FIG. 17 shows the frequency characteristic of the device that was actually built. As can be seen from both drawing, the side lobe attenuation of 25 dB and an extremely flat pass-band characteristic is achieved.

Figure 18:
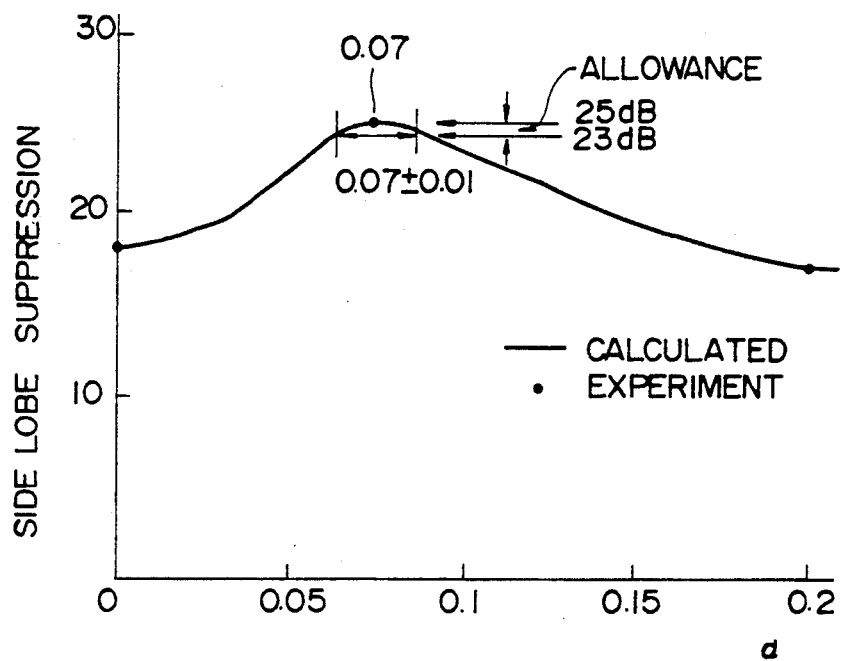
FIG. 18 is a diagram showing the principle of the second and third embodiments, showing the optimum side lobe suppression by choosing the optimum rate of reduction of the finger pairs $\alpha$ in the SAW device.

FIG. 18 shows the relationship between the obtained side lobe suppression and the parameter α representing the rate of decrease of the number of pairs of the finger electrodes.

As can be seen from FIG. 18, there is a maximum in the out-of-the-band attenuation or the side lobe suppression at $\alpha \approx 0.07$. Considering the allowable range of side lobe suppression of 23-25 dB, the optimum parameter α is determined as $$\alpha=0.07+0.03/-0.01. \quad (5)$$

In FIG. 18, an excellent agreement in the calculation and experiment can be seen.

Figure 19:
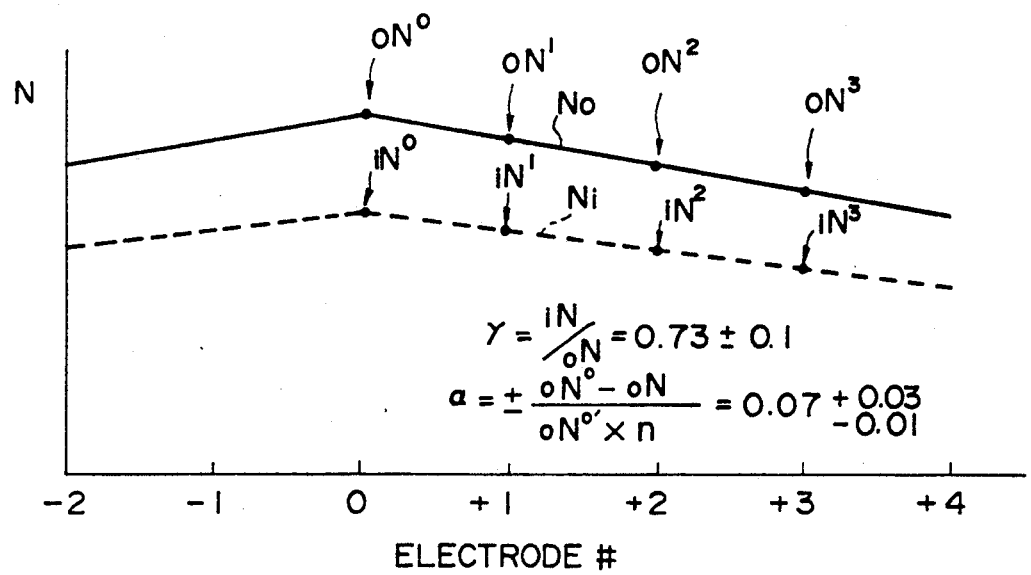
FIG. 19 is another diagram showing the principle of the second and third embodiments, showing the optimum relationship between the number of finger electrode pairs of the input electrode and the output electrode.

FIG. 19 is a diagram showing the relationship between the number of pairs of fingers in the input and output electrodes and the number # representing the order of electrode measured from the electrode having the maximum number of pairs. The number # naturally is a positive or negative integer and includes zero. It should be noted that this drawing provides the optimum relationship between the number of pairs of fingers in the input and output electrodes provided on the upper major surface of the piezoelectric substrate forming the SAW device. In the illustrated relationship, the relation $\Gamma = iN/oN = 0.73 \pm 0.1$ and the relation $\alpha = \pm(oN^0 - oN^m)/oN^0 \cdot m = 0.07 + 0.03/-0.01$ obtained previously are both satisfied.

Next, a fourth embodiment of the present invention will be described. In this embodiment, the reduction of the ripple within the pass-band is attempted, using the foregoing embodiments of the present invention, by the adjustment of the distance d between the adjacent input and output electrodes such that the pass-band, defined as the region wherein the magnitude of the ripple $\Delta Sr$ is equal to or less than 1.5 dB, is substantially increased. The pass band $\Delta f_{PB}$ and the ripple $\Delta Sr$ are already illustrated in FIGS. 14 and 15.

In the present embodiment, the distance d (FIG. 10) between the adjacent input and output electrodes is changed according to the equation $$d = (n + \beta) \cdot \lambda$$

by changing the parameter $\beta$ variously, where $\beta$ is a real number smaller than one ($\beta < 1$), and n is an integer. During this process, the foregoing relationships of $\Gamma = 0.73 \pm 0.07$ and $\alpha = 0.07 \pm 0.01$ are maintained.

Figure 20:
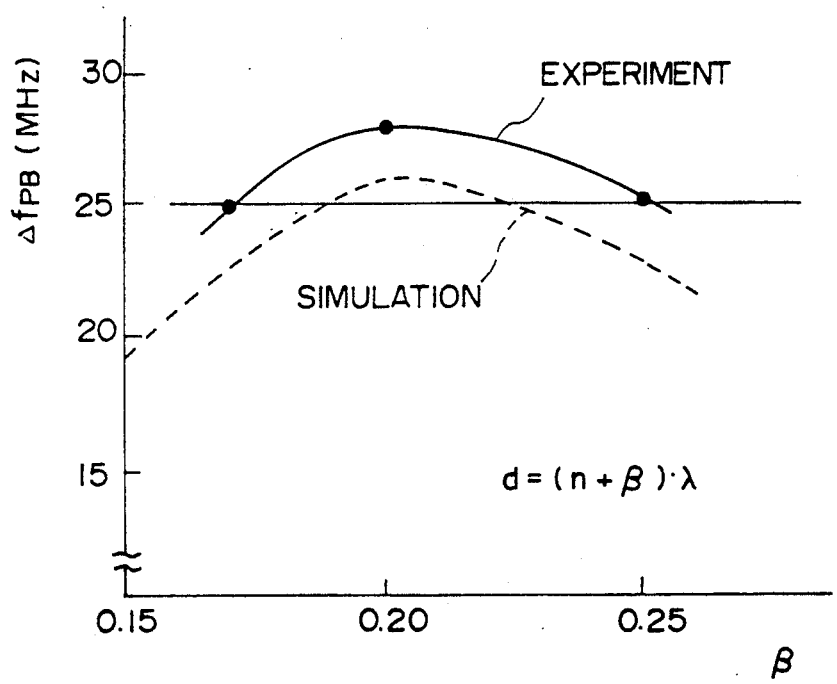
FIG. 20 is a diagram showing the principle of a fourth embodiment, showing the relationship between the pass-band and the separation between the input and output interdigital electrodes.

FIG. 20 shows the result of simulation and experiment for the search of the optimum value of $\beta$. There is a parallel relationship between the simulation and experiment with the experimental data showing larger value of the pass-band $\Delta f_{PB}$ From the experiment, it can be seen that the pass-band $\Delta f_{PB}$ of 25 MHz or more can be achieved by choosing the parameter $\beta$ to fall in the range between 0.17–0.25 or $$\beta = 0.17 - 0.25. \tag{6}$$

Figure 21:
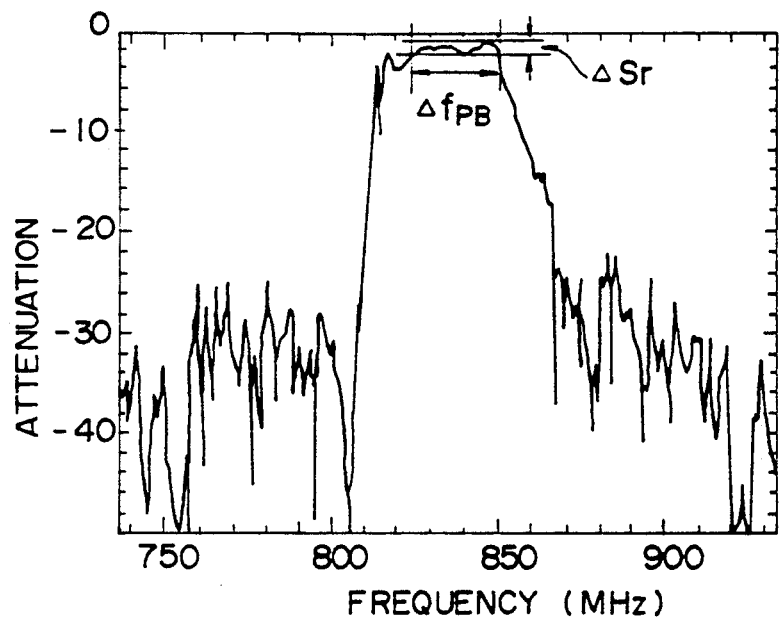
FIG. 21 is a frequency characteristic of the SAW device according to the fourth embodiment of the present invention obtained by simulation.
Figure 22:
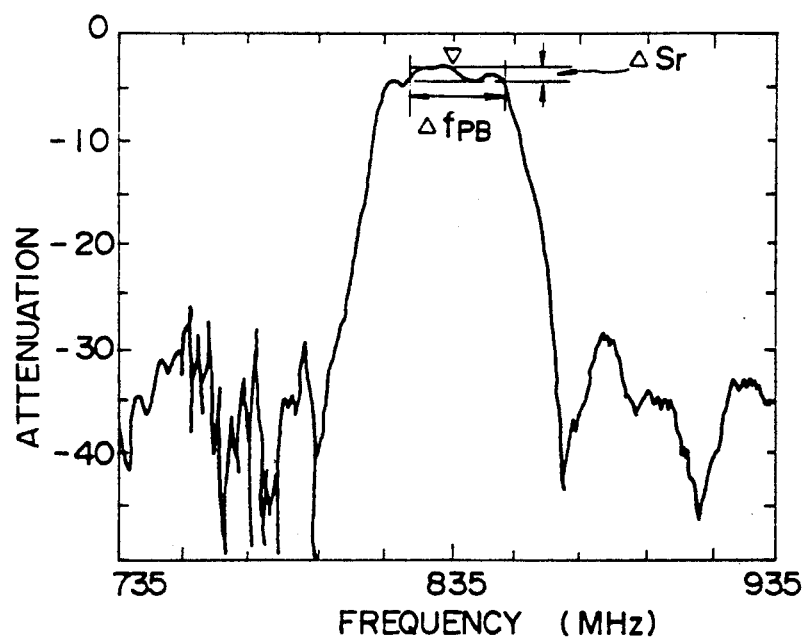
FIG. 22 is a frequency characteristic observed for the SAW device according to the fourth embodiment.

FIG. 21 shows the frequency characteristic of the SAW filter of the present embodiment having the seven input electrodes and six output electrodes as shown in FIG. 9(B), wherein the parameters are set to satisfy the relationship $oN^0 = 30$, $iN^0 = 22$, $\Gamma = 0.73 \pm 0.07$, $\alpha = 0.07 \pm 0.01$, and $\beta = 0.2$. The open strip type reflector having the thirty pairs of electrode strips was used for the reflector 4. FIG. 22, in turn, shows the frequency characteristic of the same SAW device that was actually fabricated.

As can be seen clearly from FIGS. 21 and 22, a large pass-band $\Delta f_{PB}$ of 26 MHz was obtained from the simulation while a still larger pass-band of 28 MHz was obtained by the experiment.

Figure 23:
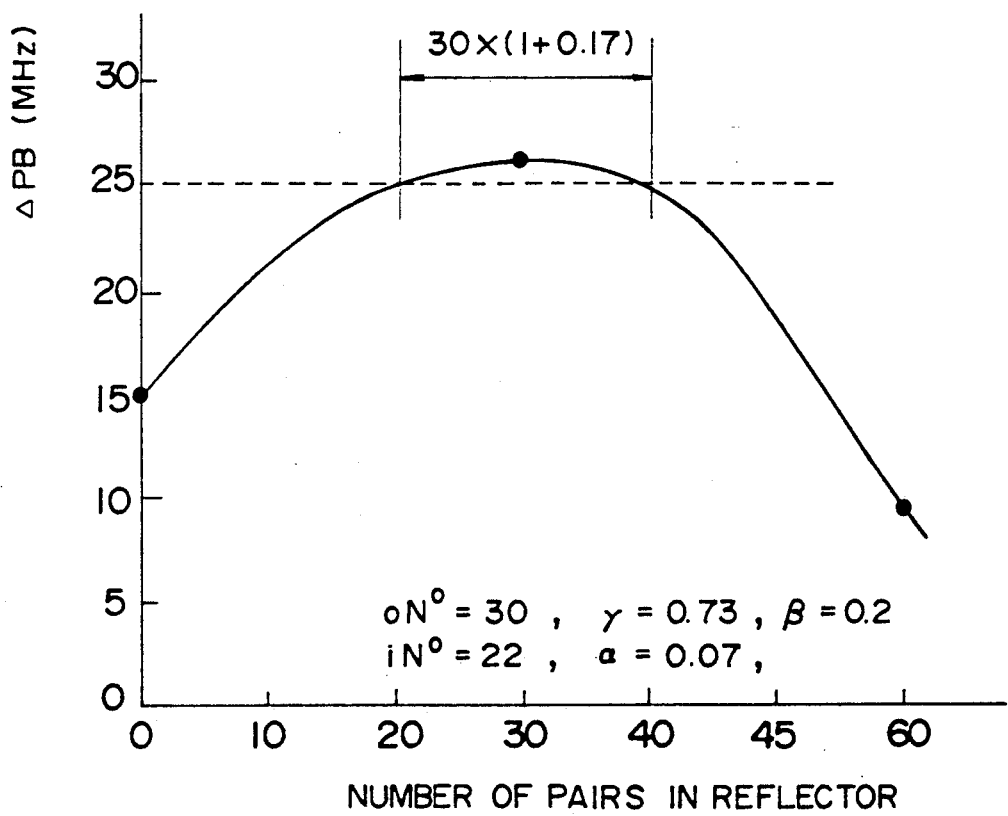
FIG. 23 is a diagram showing the principle of a first embodiment, showing the relationship between the pass-band and the number of finger electrode pairs that forms the reflector.

Next, a fifth embodiment of the present invention will be described with reference to FIG. 23 showing the effect of the reflectors 4 on the pass-band $\Delta f_{PB}$. Various parameters of the SAW device are shown in Thus, the SAW device satisfies the relationship:

$oN^0 = 30$, $\Gamma = 0.73$, $\beta = 0.2$, $iN^0 = 22$, $\alpha = 0.07$.

FIG. 23 shows the relationship between the pass-band $\Delta f_{PB}$ and the number of pairs of electrodes forming the reflector 4. As can be seen, the maximum pass band is obtained by setting the number of pairs $N_H$ of the reflector electrodes to be approximately equal to satisfy the relationship $$N_H = {}_oN^q(1 \pm 0.17). \tag{7}$$

Figure 24A:
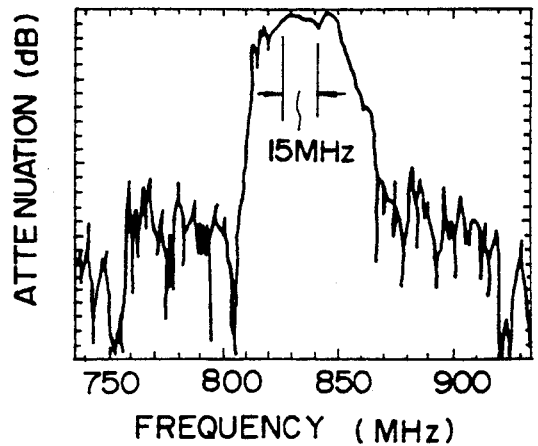
FIGS. 24(A)–24(C) are diagrams showing the frequency characteristic of the SAW device according to a fourth embodiment of the present invention.
Figure 24B:
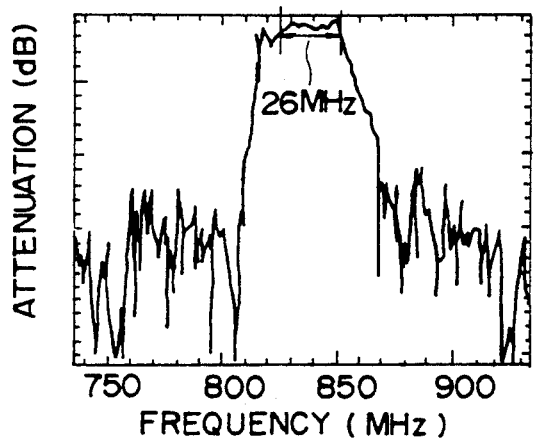
Figure 24C:
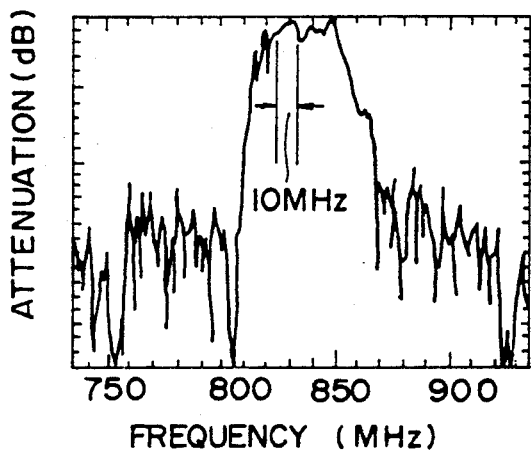

FIGS. 24(A)–24(C) show the frequency characteristic of the SAW device of the present embodiment, wherein FIG. 24(A) shows the case where no reflector 4 was employed, FIG. 24(B) shows the case where the reflector 4 has 30 pairs of electrode strips therein, and FIG. 24(C) shows the case where the reflector 4 has 60 pairs of electrode strips therein. As can be seen, the case of FIG. 24(B) where the reflector 4 satisfying Eq.(7) provides the largest pass-band $\Delta f_{PB}$.

It should be noted that, in the foregoing first through fifth embodiment, the central frequency of is by no means limited to 836 MHz, but other frequencies such as 836.5 MHz corresponding to the AMPS-Tx standard of the United States, 881.5 MHz for the AMPS-Rx standard, 932.5 MHz for the NTT of Japan, 887.5 MHz for the NTT, and the like. This is because the simulation is conducted by representing the frequency in the form of normalized frequency $f/of$.

Further, the present invention is by no means limited to the SAW devices of seven-input/six-output electrode arrangement as described heretofore, but can be applicable to the devices having the eight-input/seven-output electrode arrangement or the devices having the six-input/five-output electrode arrangement shown in FIG. 9(A). Particularly, the relationships for the parameter $\alpha$, $\beta$ and $\Gamma$ represented by Eqs.(5), (6) and (7) are valid also in the SAW devices having the six-input five-output electrode arrangement, or in the device having the eight-input seven-output arrangement.

Hereinafter, description will be made about the construction of the SAW device that has a modified inertia in the finger electrodes for increasing the pass-band in the frequency characteristic.

Figure 25:
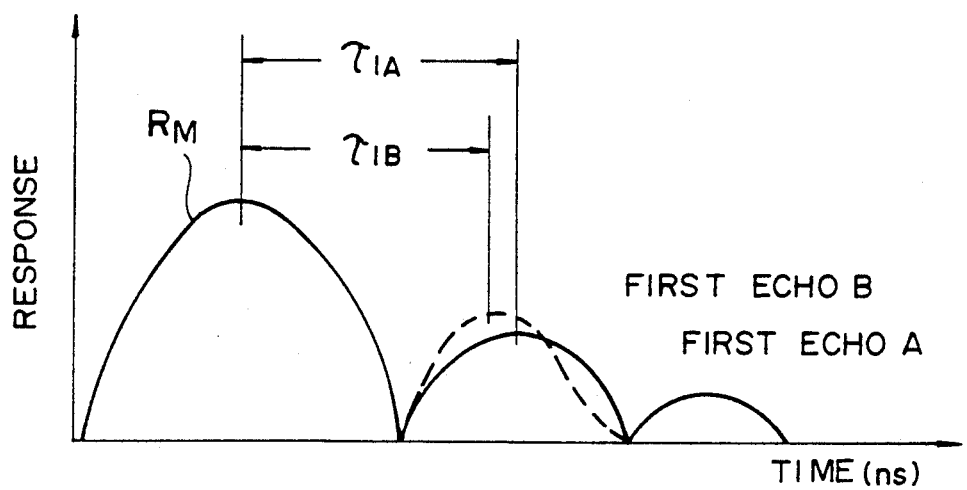
FIG. 25 is a diagram showing the impulse response for explaining the principle of the sixth through ninth embodiment of the present invention.

FIG. 25 shows a general impulse response of a typical SAW device having the multiple interdigital electrode. As can be seen, there appears a main response $R_M$ followed by a first echo A that appears after a first delay time $\tau_{1A}$. As can be easily understood, this first response is influenced significantly by reflection caused at the finger of the interdigital electrode. Thus, when there is a large difference in the acoustic impedance between the substrate and the finger electrode, the first echo may have a form shown in FIG. 25 by an echo B characterized by a smaller delay time $\tau_{1B}$ ($\tau_{1B} < \tau_{1A}$).

It is well known that the ripple in the passband of the SAW filter is influenced sensitively by the reflection by the fingers of the interdigital electrodes. For example, there holds relationship between the delay $\tau_1$ of the first echo and the ripple frequency $\Delta_r f \approx 1/\tau_1$.

Figure 26:
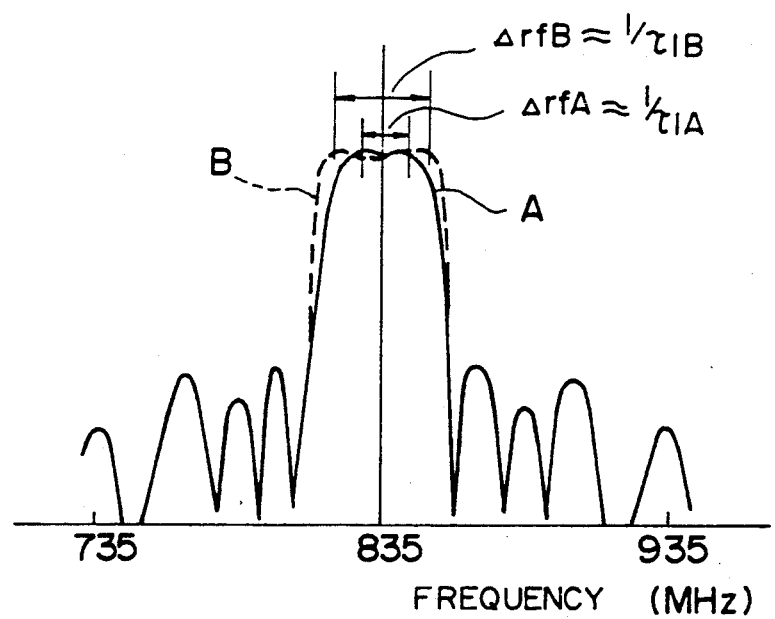
FIG. 26 is a diagram showing the effect of the delay in the first echo on the pass-band, for explaining the principle of the sixth through ninth embodiment of the present invention.

In correspondence to this, the magnitude of the pass-band that is determined by the ripple frequency, is changed as shown in FIG. 26 in response to the value of the delay $\tau_{1A}$ or $\tau_{1B}$. Thus, there is a possibility of expanding the pass-band by suitably adjusting the impulse response of the SAW filter. In the embodiments to be described hereinafter, such an expansion of the pass-band is achieved by changing the inertia of the finger electrodes of the output interdigital electrode, either by providing grooves between the fingers or by providing additional mass on the fingers.

Next, a sixth embodiment of the present invention for further increasing the pass-band $\Delta f_{PB}$ will be described. In the drawing, the parts that have been described previously are represented by the same reference numerals and the description thereof will be omitted.

Figure 27:
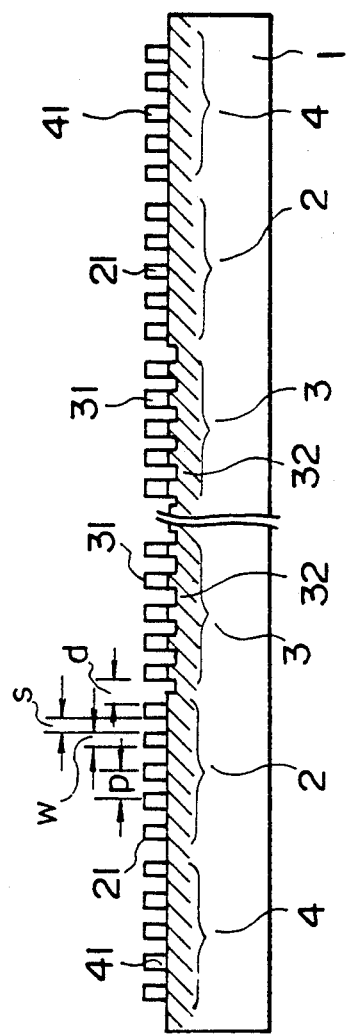
FIG. 27 is a diagram showing the structure of the SAW device according to a fifth embodiment of the present invention.

Referring to FIG. 27, each input interdigital electrode 2 has a number of finger electrodes 21, each output interdigital electrode 3 has a number of finger electrodes 31, and each reflector 4 has a number of finger electrodes or strips 41 on the surface of the substrate. The parameters W, S, P and d are set similar to the first embodiment. Thereby, the SAW device has the central frequency of of 836 MHz similar to the first embodiment.

In this embodiment, the surface of the substrate 1 that is occupied by the output electrodes 3 is subjected to an etching process except of course for the part that is covered by the finger electrodes 31. Thereby, there are formed a number of parallel grooves 32 in the direction of the finger electrode 31 with a depth of typically 84 nm.

Figure 31:
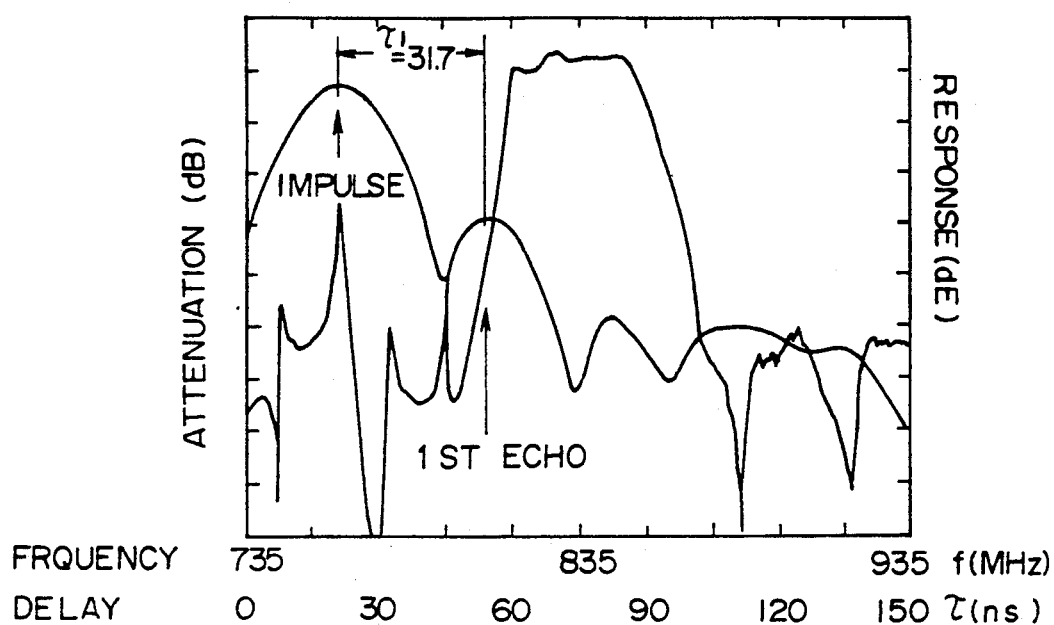
FIG. 31 is a diagram showing the impulse response and the frequency characteristic of the fifth embodiment of the present invention.
Figure 32:
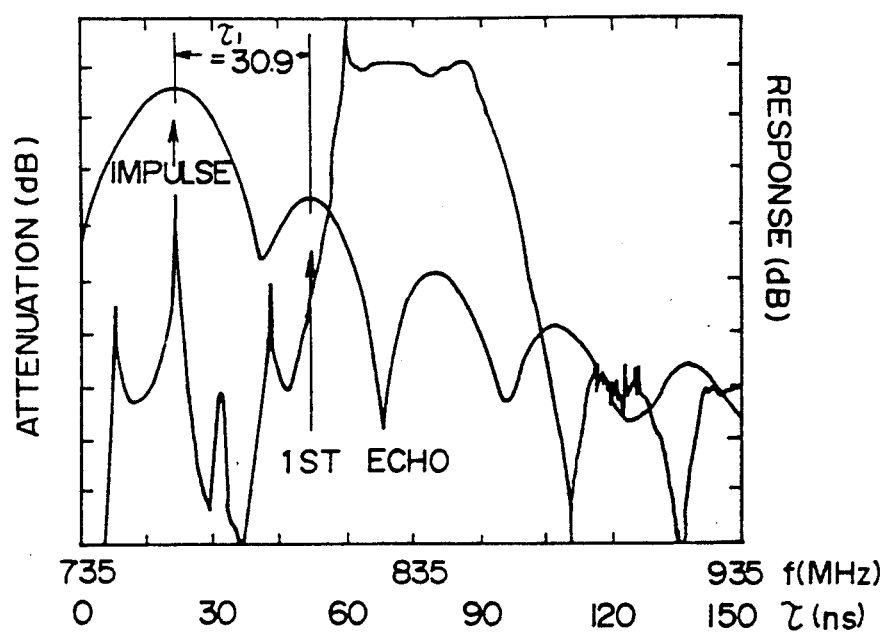
FIG. 32 is a diagram showing the impulse response and the frequency characteristic of the sixth embodiment of the present invention.

FIG. 31 shows the frequency characteristic and the impulse response of the SAW filter of the present embodiment. As can be seen from this drawing, the delay $\tau_1$ of the first echo from the main impulse is reduced to 31.7 nsec as compared with the fourth embodiment where the delay $\tau_1$ is 32.3 nsec, the pass-band $\Delta f_{PB}$ defined as the range wherein the ripple of the frequency characteristic falls within the range of 1.5 dB, is increased to 27 MHz.

Figure 28:
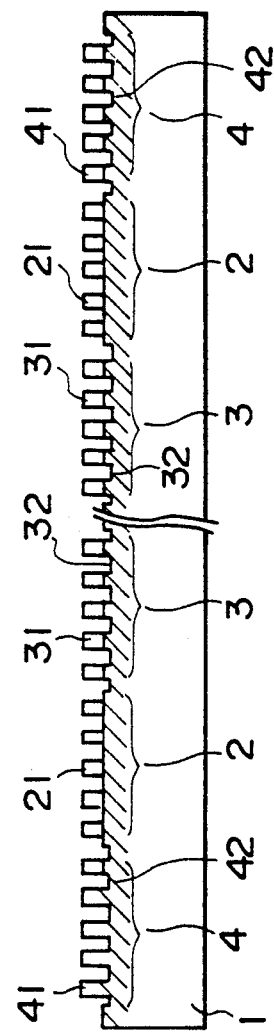
FIG. 28 is a diagram showing the structure of the SAW device according to a sixth embodiment of the present invention.

FIG. 28 shows the seventh embodiment, wherein similar grooves 42 are formed in the region of the substrate 1 occupied by the reflectors 4 in addition to the region occupied by the output electrodes. Thus, the grooves are formed parallel with each other between the finger electrodes 41 forming the reflector 4 in the direction of elongation of the fingers 41. The depth of the grooves 42 also may be set to 84 nm.

FIG. 31 shows the frequency characteristic and the impulse response of the SAW filter of the present embodiment. As can be seen from this drawing, the delay $\tau_1$ is reduced further to 30.9 nsec, and in correspondence to this, the pass-band $\Delta f_{PB}$ is increased further to 39 MHz.

The applicants of the invention further conducted research by providing the grooves in the input interdigital electrodes 2. However, it turned out that the provision of the grooves in the electrode 2 does not improve the operational characteristics of the SAW device. The following TABLE I lists the relationship between the delay $\tau_1$ and the pass-band $\Delta f_{PB}$ for various settings of the grooves.

TABLE I

| GROOVES | DELAY | PASS-BAND | EVALUATION |
|---|---|---|---|
| NO | 32.2 ns | 21 MHz | REF |
| REFLECTOR | 38.2 ns | 8 MHz | NO |
| INPUT ELECTRODE | 32.3 ns | 20 MHz | NO |
| INPUT ELECTRODE + REFLECTOR | 35.2 ns | 20 MHz | NO |
| OUTPUT ELECTRODE | 31.7 ns | 30 MHz | YES |
| OUTPUT ELECTRODE + REFLECTOR | 30.9 ns | 36 MHz | YES |

For example, in the experiment wherein a similar groove is formed in the input interdigital electrode 2, the obtained delay $\tau_1$ becomes to be 32.3 ns and the corresponding pass-band $\Delta f_{PB}$ becomes to be 20 MHz. When the grooves are formed in the reflector 4 alone, the delay $\tau_1$ becomes 38.2 nsec and the pass-band $\Delta f_{PB}$ becomes 8 MHz. Further, when the grooves are formed both in the input electrode 2 and the reflector 4, the delay $\tau_1$ is 35.2 ns and the pass-band $\Delta f_{PB}$ becomes 20 MHz. Thus, it was concluded that the provision of the grooves in correspondence to the input electrode 2 does not cause the intended improvement in the SAW device characteristic but an unwanted deterioration.

Figure 29:
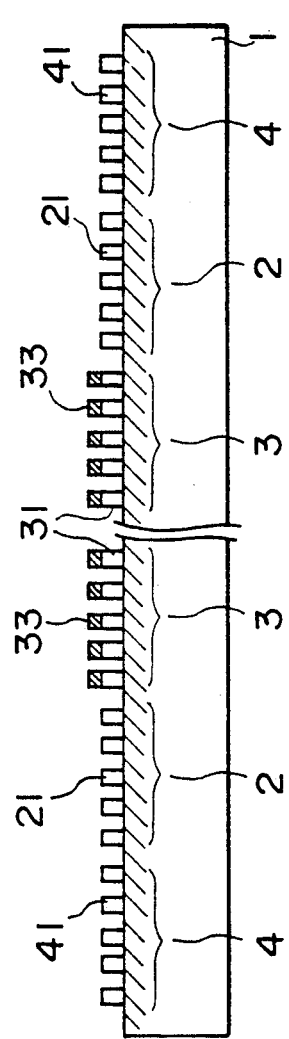
FIG. 29 is a diagram showing the structure of the SAW device according to a seventh embodiment of the present invention.

Next, an eighth embodiment of the present invention will be described with reference to FIG. 29.

In this embodiment, each finger of the output electrodes 3 is provided with an additional layer 33 that may comprise a layer of Cr having a thickness of 15 nm and another layer of $Cr_2O_3$ deposited on the Cr layer with a thickness of 35 nm.

Figure 33:
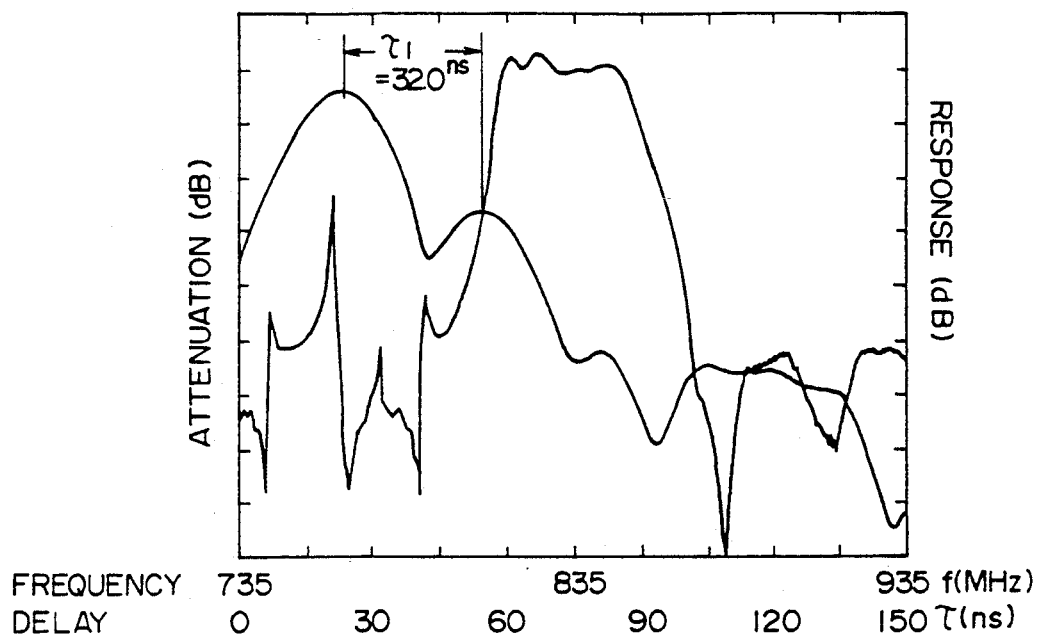
FIG. 33 is a diagram showing the impulse response and the frequency characteristic of the seventh embodiment of the present invention.

FIG. 33 shows the frequency characteristic and impulse response of the SAW device of the present embodiment. As can be seen from FIG. 33, the delay $\tau_1$ between the main impulse and the first echo is decreased from 32.3 nsec to 32.0 nsec as compared to the fifth embodiment, and in correspondence thereto, the pass-band $\Delta f_{PB}$ is increased from 21 MHz where no such additional layer is provided to 27 MHz.

Figure 30:
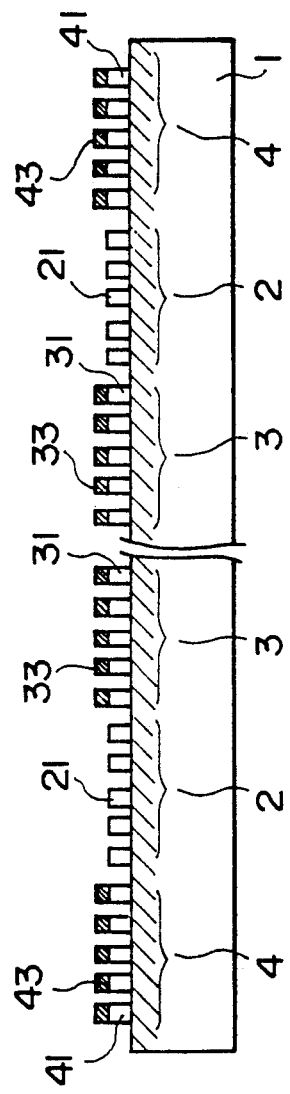
FIG. 30 is a diagram showing the structure of the SAW device according to an eighth embodiment of the present invention.

FIG. 30 shows a ninth embodiment of the present invention wherein additional layers 43 are provided also on the fingers 41 of the reflector 4. Similar to the layer 33, the layer 43 comprises a layer of Cr having the thickness of 15 nm and a layer of $Cr_2O_3$ grown thereon with a thickness of 35 nm.

Figure 34:
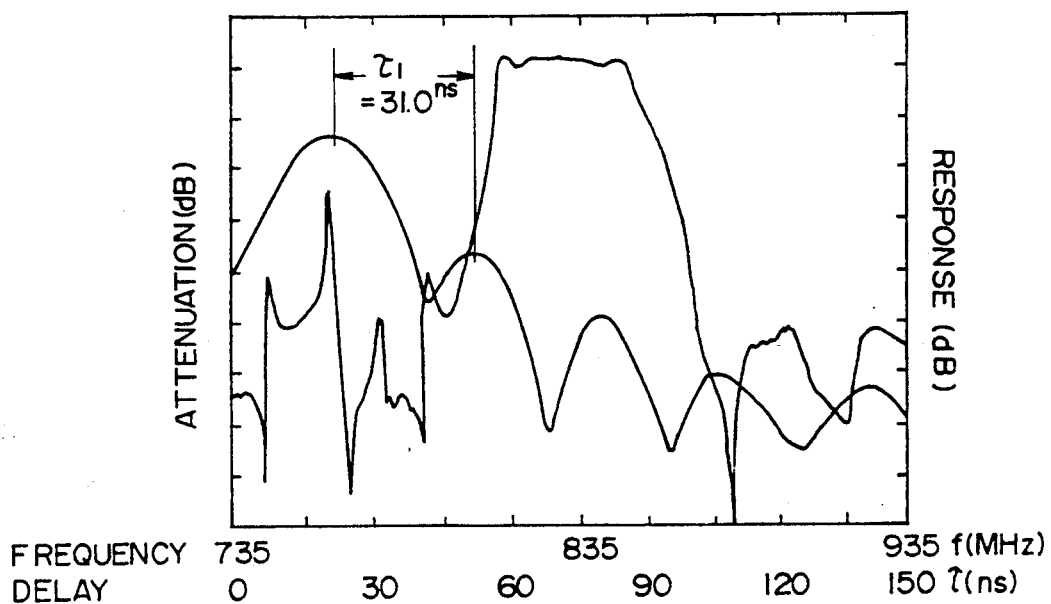
FIG. 34 is a diagram showing the impulse response and the frequency characteristic of the eighth embodiment of the present invention.

FIG. 34 shows the frequency characteristic and impulse response for this embodiment. As can be seen, the delay $\tau_1$ of 31.0 nsec is obtained, and in correspondence to this, a very large pass-band $\Delta f_{PB}$ of 38 MHz can be achieved.

Figure 35:
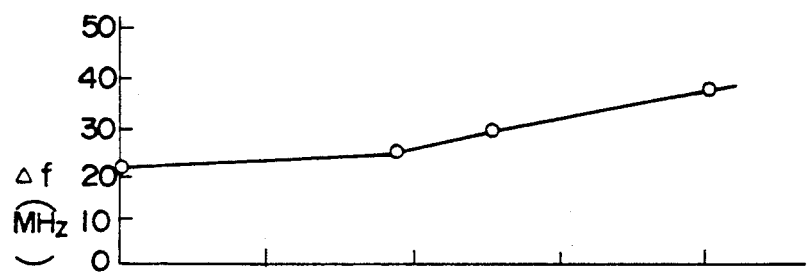
FIG. 35 is a diagram showing the relationship between the pass-band and the depth of the grooves in the sixth embodiment.
Figure 36:
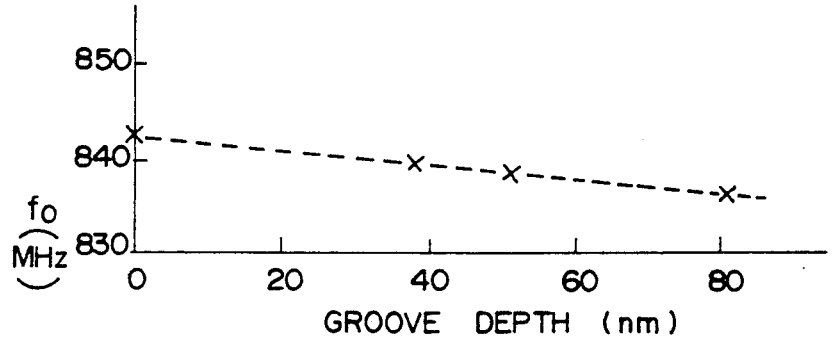
FIG. 36 is a diagram showing the relationship between the central frequency and the depth of the grooves in the sixth embodiment.

FIG. 35 shows the relationship between the depth of the grooves, pass band $\Delta f_{PB}$ and the central frequency of for the case of the seventh embodiment, wherein there is a tendency that the pass-band $_{PB}$ increases with increasing depth of the grooves while the central frequency of tends to be decreased with the increase in the groove depth. Thus, this shift in the central frequency has to be counted in when designing the SAW filter according to the principle of the present invention.

The excessive groove depth may cause the increased insertion loss of the SAW filter by the scattering of the surface acoustic waves at the grooves. However, this problem is not significant as long as the groove depth is in the order as shown in the embodiments. The maximum depth of the grooves may be determined from the tolerable insertion loss of the SAW filter.

Figure 37:
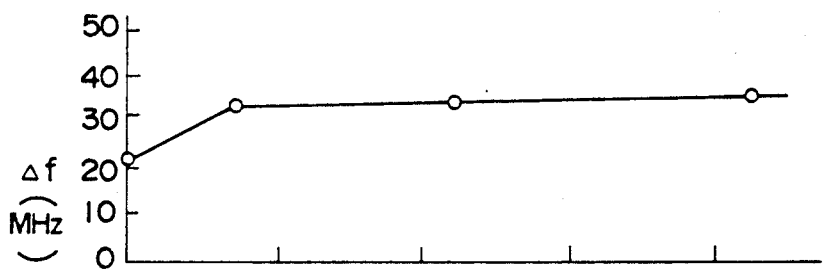
FIG. 37 is a diagram showing the relationship between the pass-band and the depth of the grooves in the eighth embodiment.
Figure 38:
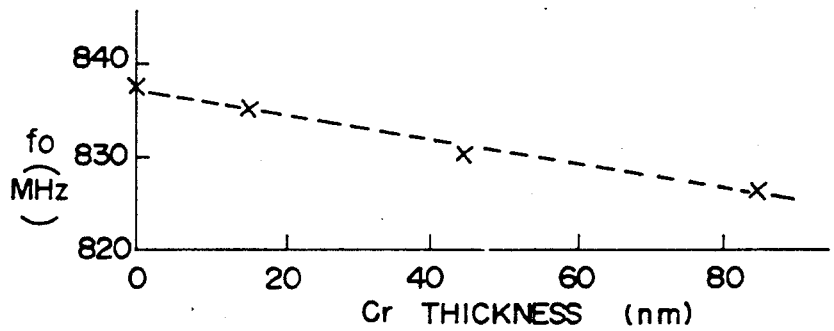
FIG. 38 is a diagram showing the relationship between the central frequency and the depth of the grooves in the eighth embodiment.

FIG. 37 shows the relationship between the depth of the grooves, pass-band $\Delta f_{PB}$ and the central frequency of for the ninth embodiment. As can be seen, the pass-band $\Delta f_{PB}$ tends to increase with increasing thickness of the layers 33 and 43 while the central frequency of tends to decrease in correspondence thereto. Thus, when designing the SAW device using such an additional layer for increasing the pass-band, one has to consider the effect of shift of the central frequency of.

Next, the process for fabricating the grooved structure of FIG. 27 or FIG. 28 will be described with reference to FIGS. 39(A)–39(E).

Figure 39A:
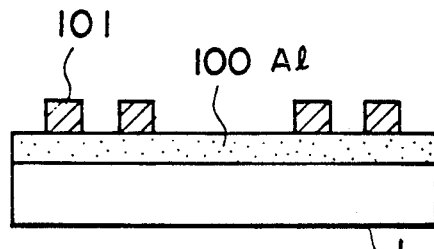
FIGS. 39(A)–39(E) are diagrams showing the steps for forming the grooves between the fingers of selected interdigital electrodes.

In a step of FIG. 39(A), an aluminum-copper film 100 is deposited by the D.C. sputtering process with a thickness of 170 Å. Further, a resist of any known type is applied on the surface of the film 100 and patterned photolithographically into a first resist pattern 101. Thereby, the structure shown in FIG. 39(A) is obtained.

Figure 39B:
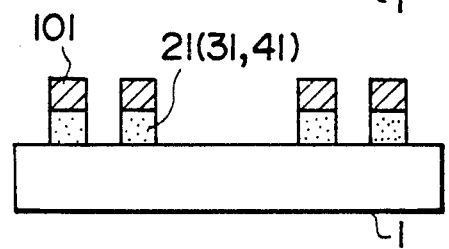

Next, using the first resist pattern 101 as the mask, the aluminum-copper film 100 is subjected to a reactive ion etching process as shown in FIG. 39(B) such that the fingers of the interdigital electrodes and reflectors are formed.

Figure 39C:
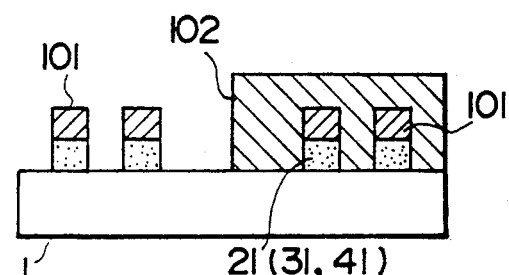
Figure 39D:
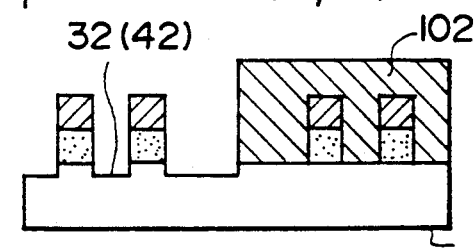
Figure 39E:
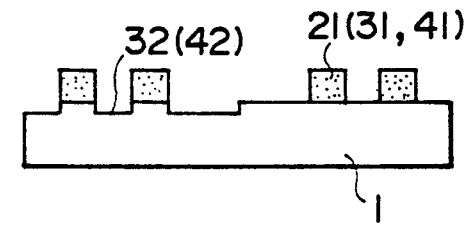

Next, while leaving the first photoresist pattern 101 on each finger electrode, a second resist pattern 102 is applied in correspondence to the region of the electrode where the grooves are not to be formed as shown in FIG. 39(C). Further, by using the first and second resist patterns 101 and 102 as the mask, the substrate 1 is subjected to the reactive ion etching such that the exposed surface of the substrate 1 between the finger electrodes is grooved as shown in FIG. 39(D). After the grooves 32 or 42 are formed, the first and second resist patterns 101 and 102 are removed as usual. In this process, the depth of the groove is controlled exactly by controlling the duration of the etching in the step of FIG. 39(D).

Next, the process for forming the additional layers 33 or 43 on the finger of the output interdigital electrode 3 or on the finger of the reflector 4 will be described with reference to FIGS. 40(A)–40(E).

Figure 40A:
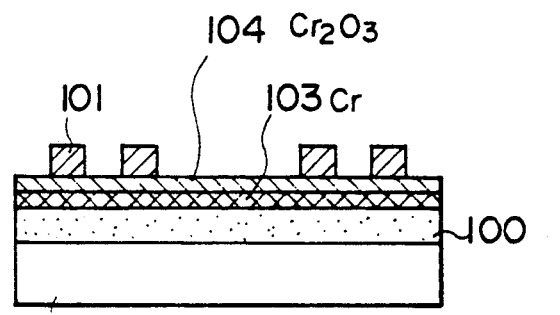
FIGS. 40(A)–40(E) are diagrams showing the steps for forming material layers in correspondence to some of the finger electrodes of the interdigital electrodes.

Referring to FIG. 40(A), the layer 100 of aluminum-copper alloy is deposited on the substrate 1 by the sputtering process similarly to the process of FIG. 39(A), and a layer 103 of Cr and a layer 104 of $Cr_2O_3$ are deposited consecutively with a thickness of 50 nm and 35 nm, respectively. Further, a photoresist is applied uniformly over the $Cr_2O_3$ layer 104 and patterned subsequently to form a first resist pattern 101.

Figure 40B:
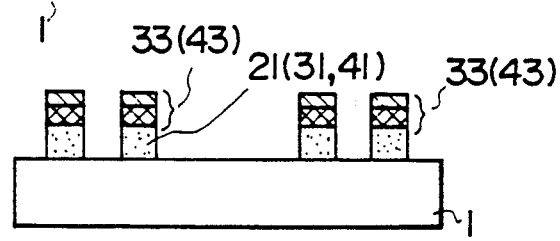
Figure 40C:
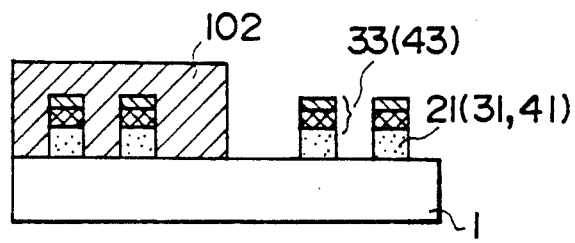
Figure 40D:
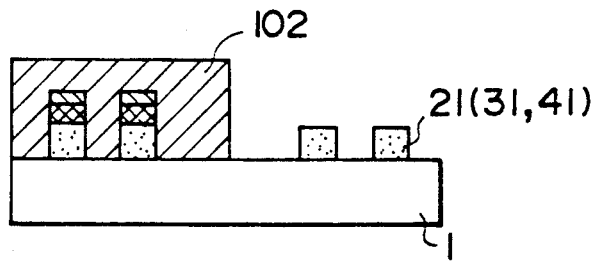
Figure 40E:
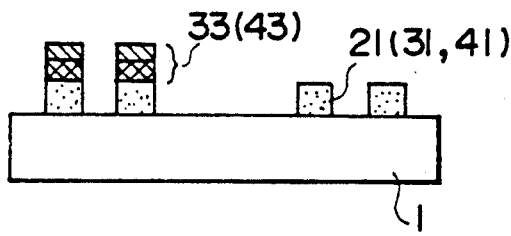

In a step of FIG. 40(B), an etching process is applied to the structure of FIG. 40(A) until the substrate 1 is exposed. Next, after the removal of the resist 101, a second resist pattern 102 is provided in a step of FIG. 40(C) in correspondence to the part of the electrode or reflector wherein the layer 33 is to be left on the top of the finger electrode 31 or 41. Further, the layer 33 on the exposed finger electrode is removed by the etching process, and a structure shown in FIG. 40(D) is obtained. After removing the second resist pattern 102, the structure of FIG. 40(E) is obtained.

Further, the present invention is not limited to the embodiments described heretofore, but various variations and modifications may be made without departing from the scope of the invention.

What is claimed is:

1. A surface-acoustic-wave device, comprising:

a generally rectangular substrate of a piezoelectric material and having an upper major surface;

a plurality of input electrodes provided on the upper major surface of the substrate for inducing a surface acoustic wave on the upper major surface of the substrate in response to an input electric signal supplied thereto, each of said plurality of input electrodes comprising a plurality of first finger electrodes extending on the major surface of the substrate with a parallel relationship from each other in a first direction, each of the plurality of first finger electrodes having a first end connected with each other to form an input terminal for receiving the input electric signal, each of the plurality of first finger electrodes further having a second, opposing, free end, each of said plurality of input electrodes further comprising a plurality of second finger electrodes extending on the major surface of the substrate with a parallel relationship from each other in an opposing, second direction to the first finger electrodes, each of the plurality of second finger electrodes having a first end that is offset from the first end of the first finger electrodes in the first direction such that each of the first end of the second finger electrodes is connected with each other to the ground and each of the plurality of second finger electrodes further having a second, opposing, free end such that the second free end is close to the first end of the first finger electrodes, each of said first and second finger electrodes being disposed alternately in a third direction perpendicular to the first and second directions on the upper major surface of the substrate to form a pair such that each input electrode is characterized by a first pair number representing the number of pairs of the first and second fingers;

a plurality of output electrodes provided on the upper major surface of the substrate for converting the surface acoustic wave to an output electric signal, each of said plurality of output electrodes comprising a plurality of third finger electrodes extending on the major surface of the substrate with a parallel relationship from each other in the second direction, each of the plurality of third finger electrodes having a first end connected with each other to form an output terminal, each of the plurality of third finger electrodes further having a second, opposing, free end, each of said plurality of output electrodes further comprising a plurality of fourth finger electrodes extending on the major surface of the substrate with a parallel relationship from each other in the first direction, each of the plurality of fourth finger electrodes having a first end that is offset from the first end of the third finger electrodes in the second direction such that each of the first end of the fourth finger electrodes is connected with each other to the ground and each of the plurality of fourth finger electrodes further having a second, opposing, free end such that the second free end is close to the first end of the third finger electrodes, each of said third and fourth finger electrodes being disposed alternately in the third direction on the upper major surface of the substrate to form a pair, such that each output electrode is characterized by a second pair number representing the number of pairs of the third and fourth fingers;

each input electrode and each output electrode being disposed alternately in the third direction to form a row of electrodes extending in the third direction; and a reflector provided on the major surface of the substrate at both ends of the row of electrodes for reflecting the surface acoustic wave;

wherein said first pair number is set different from said second pair number with a predetermined ratio therebetween, said second pair number being changed gradually in each second electrode, and said first pair number is changed in each first electrode in correspondence to the change of said pair number.

2. A surface acoustic wave device as claimed in claim 1 in which said reflector comprises a plurality of fifth finger electrodes extending on the major surface of the substrate with a parallel relationship from each other in the second direction, each of the plurality of fifth finger electrodes having a first end connected with each other, each of the plurality of fifth finger electrodes further having a second, opposing, free end, said reflector further comprising a plurality of sixth finger electrodes extending on the major surface of the substrate with a parallel relationship from each other in the first direction, each of the plurality of sixth finger electrodes having a first end that is offset from the first end of the fifth finger electrodes in the second direction such that each f the first end of the sixth finger electrodes is connected with each other to the ground, and each of the plurality of sixth finger electrodes further having a second, opposing, free end such that the second free end is close to the first end of the fifth finger electrodes, each of said fifth and sixth finger electrodes being disposed alternately in the third direction on the upper major surface of the substrate to form a pair such that the reflector is characterized by a third number of pairs representing the number of pairs of the fifth and sixth finger electrodes.

3. A surface acoustic wave device as claimed in claim 2 in which said input electrodes and output electrodes are formed such that the first pair number iN of an input electrode and the second pair number oN of an adjacent output electrode satisfy a relationship $$iN/oN = 0.73 \pm 0.07.$$

4. A surface acoustic wave device as claimed in claim 3 in which said plurality of output electrodes are formed to satisfy a relationship $$(oN^0 - oN^m)/oN^0 . m = \pm 0.07 \pm 0.01$$

where $oN^0$ represents the maximum of the second pair number, m represents the m-th output electrode in the row counted from the output electrode that has the maximum second pair number, and $oN^m$ represents the second pair number of the m-th output electrode.

5. A surface acoustic wave device as claimed in claim 4 in which each center of said input electrode is separated from the center of the adjacent output electrode by a distance d that satisfies a relationship $$d = (n + \beta) \cdot \lambda,$$

where $\lambda$ represents the wavelength of the surface acoustic wave, n is a positive integer, and $\beta$ is a parameter set to fall in a range between 0.17 and 0.25.

6. A surface acoustic wave device as claimed in claim 5 in which said reflector has the third pair number that is chosen to fall within ±17% of the maximum of the second pair number $oN^0$.

7. A surface acoustic wave device as claimed in claim 1 having seven input electrodes and six output electrodes.

8. A surface acoustic wave device as claimed in claim 4 in which said first and second number of pairs are changed symmetrically along the row of input and output electrodes about a central part thereof.

9. A surface acoustic wave device as claimed in claim 4 in which said first and second number of pairs are changed asymmetrically along the row of input and output electrodes.

10. A surface acoustic wave device as claimed in claim 5 in which said upper major surface of the substrate is formed with grooves in correspondence to the output electrodes except for those parts covered by the third and fourth finger electrodes.

11. A surface acoustic wave device as claimed in claim 10 in which said grooves are formed with a depth of about 84 nm or less.

12. A surface acoustic wave device as claimed in claim 10 in which said upper major surface of the substrate is formed with grooves in correspondence to the reflectors except for those parts covered by the fifth and sixth finger electrodes.

13. A surface acoustic wave device as claimed in claim 5 in which each of said third and fourth finger electrodes forming the output electrodes are provided with a material layer.

14. A surface acoustic wave device as claimed in claim 13 in which each of said fifth and sixth finger electrodes forming the reflector are provided with the material layer.

15. A surface acoustic wave device as claimed in claim 14 in which said material layer comprises a layer of chromium having a thickness of 50 nm and a layer of chromium oxide grown thereon with a thickness of 35 nm.

* * * * *

UNITED STATES PATENT AND TRADEMARK OFFICE
CERTIFICATE OF CORRECTION

PATENT NO. : 5,179,310

DATED : January 12, 1993

INVENTOR(S) : Satoh et al.

It is certified that error appears in the above-identified patent and that said Letters Patent is hereby corrected as shown below:

- Column 1, line 23, change "ar" to --are--.

- Column 4, line 59, after "the" (first occurrence only) insert --principle--.

-. Column 5, line 1, change "8" to --9--;

line 49, change "first" to --fifth--.

- Column 6, line 44, change

"H($\propto$)$\omega$sin(iN$\pi$X)/iN$\pi$X.sin" to

--H(w)$\infty$sin(iN$\pi$X)/iN$\pi$X$\cdot$sin--.

UNITED STATES PATENT AND TRADEMARK OFFICE
CERTIFICATE OF CORRECTION

PATENT NO. : 5,179,310
DATED : January 12, 1993
INVENTOR(S) : Satoh et al.

It is certified that error appears in the above-identified patent and that said Letters Patent is hereby corrected as shown below:

- Column 7, line 36, change "10b" to --10be--;

line 59, change "Tfans." to

--Trans.--.

- Column 8, line 16, change "were" to --where--;

line 41, change "$r^n=(-1)^2$" to

--$r^n=(-1)^n$--.

- Column 9, line 56, change "$2_{M \cdot 2}$" to --$2_{M \cdot 2}$--.

- Column 10, line 39, after "is" insert

--sought for. The optimum relationship thus found is--;

UNITED STATES PATENT AND TRADEMARK OFFICE
CERTIFICATE OF CORRECTION

PATENT NO. : 5,179,310
DATED : January 12, 1993
INVENTOR(S) : Satoh et al.

It is certified that error appears in the above-identified patent and that said Letters Patent is hereby corrected as shown below:

line 67, change "of" (first occurrence only) to --to--.

- Column 11, line 9, change "eleotrodes" to --electrodes--;

line 61, change "o" to --a--.

- Column 12, line 14, change "On" to --on--;

line 14, before "Re-" delete --Q--;

line 31, delete "32".

- Column 13, line 34, after "$\Delta f_{PB}$" insert --.--;

line 58, after "in" insert --FIG 23--.

UNITED STATES PATENT AND TRADEMARK OFFICE
CERTIFICATE OF CORRECTION

PATENT NO. : 5,179,310

DATED : January 12, 1993

INVENTOR(S) : Satoh et al.

It is certified that error appears in the above-identified patent and that said Letters Patent is hereby corrected as shown below:

- Column 14, line 16, change "of" to --fo--;

line 23, change "of" (second occurrence only) to --fo--;

line 51, change "passband" to --pass-band--.

- Column 15, line 10, change "of" (first occurrence only) to --fo--.

- Column 16, line 34, change "of" (first occurrence only) to --fo--;

line 37, change "of to --fo--;

line 50, change "of" to --fo--;

line 52, change "of" to --fo--;

UNITED STATES PATENT AND TRADEMARK OFFICE
CERTIFICATE OF CORRECTION

PATENT NO. : 5,179,310
DATED : January 12, 1993
INVENTOR(S) : Satoh et al.

It is certified that error appears in the above-identified patent and that said Letters Patent is hereby corrected as shown below:

line 56, change "of" (third occurrence only) to --fo--.

- Column 18, line 59, after "said" insert --second--.

- Column 19, line 7, change "f" to --of--.

Signed and Sealed this

Twenty-first Day of December, 1993

Attest:

BRUCE LEHMAN

Attesting Officer     Commissioner of Patents and Trademarks